United States Patent
Yang et al.

(10) Patent No.: US 8,143,958 B2
(45) Date of Patent: Mar. 27, 2012

(54) SYSTEMS AND METHODS FOR SELF TESTING A VOLTAGE CONTROLLED OSCILLATOR IN AN OPEN LOOP CONFIGURATION

(75) Inventors: Jeongsik Yang, Cupertino, CA (US); Jin Wook Kim, San Jose, CA (US); Hong Sun Kim, San Jose, CA (US); Sang-Oh Lee, Cupertino, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 110 days.

(21) Appl. No.: 12/469,548

(22) Filed: May 20, 2009

(65) Prior Publication Data
US 2010/0295622 A1 Nov. 25, 2010

(51) Int. Cl.
*H03L 7/099* (2006.01)
*G01R 23/00* (2006.01)
(52) U.S. Cl. ............... 331/44; 331/1 A; 331/179
(58) Field of Classification Search ............ 331/44, 331/179, 1 A, 10, 11, 14, 16; 327/156
See application file for complete search history.

(56) References Cited

U.S. PATENT DOCUMENTS

| | | | |
|---|---|---|---|
| 7,183,866 B2 * | 2/2007 | Yang et al. | 331/74 |
| 7,301,414 B2 * | 11/2007 | Hino | 331/179 |
| 7,675,370 B2 * | 3/2010 | Sun et al. | 331/44 |
| 2003/0050029 A1 | 3/2003 | Kaufmann et al. | |
| 2003/0214360 A1 | 11/2003 | Motoyoshi et al. | |
| 2005/0012555 A1 | 1/2005 | Nord et al. | |
| 2010/0102894 A1 | 4/2010 | Sun et al. | |
| 2010/0237954 A1 * | 9/2010 | Hall et al. | 331/44 |

FOREIGN PATENT DOCUMENTS

| | | |
|---|---|---|
| WO | WO 03044961 | 5/2003 |
| WO | WO 2006070224 | 7/2006 |

OTHER PUBLICATIONS

Frank Demmerle Ed-Lee Whetsel: "Integrated RF-CMOS Transceivers challenge RF Test" Test Conference, 2006. ITC '06. IEEE International, IEEE, PI, Oct. 1, 2006, pp. 1-8, XP031014774 ISBN: 978-1-4244-0291-5.
International Search Report and Written Opinion—PCT/US2010/035688, International Search Authority—European Patent Office—Aug. 26, 2010 (082282).

* cited by examiner

*Primary Examiner* — Ryan Johnson
(74) *Attorney, Agent, or Firm* — William M. Hooks

(57) ABSTRACT

Methods and apparatus for self testing a multiband voltage controlled oscillator (VCO) are disclosed. A tuning voltage of the VCO is adjusted where the output of the VCO does not affect the input to the VCO. Frequency bands in the VCO are selected. Output frequencies of the VCO are measured.

21 Claims, 18 Drawing Sheets

SYSTEMS AND METHODS FOR SELF TESTING A VOLTAGE CONTROLLED OSCILLATOR IN AN OPEN LOOP CONFIGURATION

TECHNICAL FIELD

The present disclosure relates generally to communication systems. More specifically, the present disclosure relates to self testing a multiband voltage controlled oscillator in an open loop configuration.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

This increased complexity has led to an increased need for testing that can test digital circuits and/or digital systems. As technology advances, it may be more and more important that particular circuits and/or digital systems are reliable. Therefore, the testing used to verify or test various parts of devices, such as pieces of hardware, and/or software are also increasing in importance.

In many cases the equipment used to test a device is a separate piece of equipment than the device being tested. In some testing configurations, test equipment may monitor one or more functions of the device while the device performs the function(s). Therefore, the device and the test equipment may be monopolized for the duration of the testing. Furthermore, the test equipment may be expensive to use. In contrast, a self test may be performed in some configurations with little or no involvement required from test equipment. Benefits may be realized, therefore, by providing improved methods and apparatus for providing built in self tests for electronic devices and/or components used in electronic devices.

DETAILED DESCRIPTION

Figure 1:
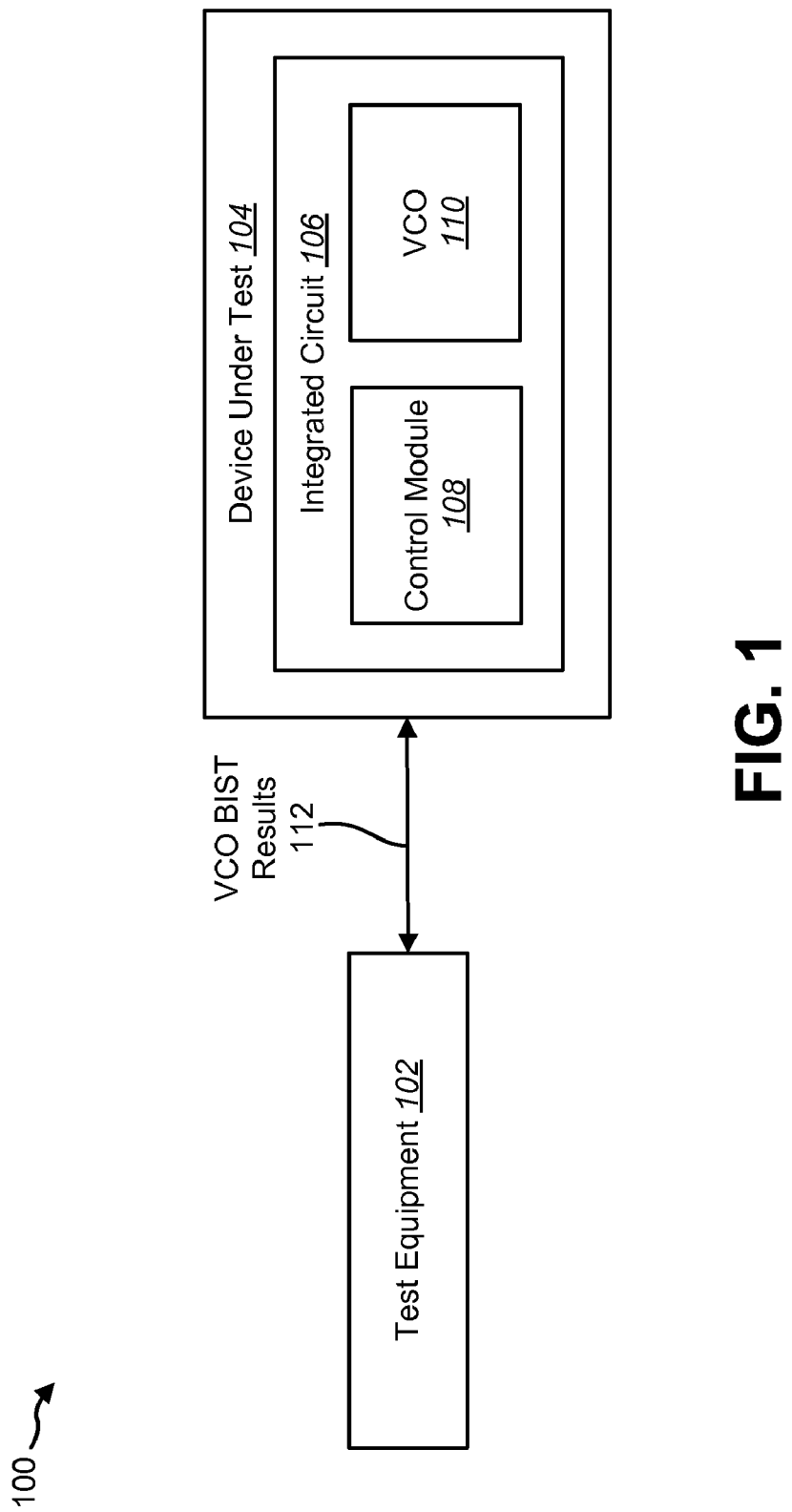
FIG. 1 is a block diagram illustrating a system for self testing a multiband voltage controlled oscillator (VCO) in an open loop configuration.

A method for self testing a multiband voltage controlled oscillator is disclosed. A tuning voltage of the VCO is adjusted where the output of the VCO does not affect the input to the VCO. Frequency bands in the VCO are selected. Output frequencies of the VCO are measured.

In one configuration, the adjusting may be performed by a programmable tuning voltage generator. One or more characteristics about the VCO may also be determined based on the output frequencies. The adjusting, selecting, measuring, and determining may be repeated only if the characteristics meet a minimum threshold. In one configuration, the self testing may be performed on a single integrated circuit.

A frequency overlap error between the frequency bands in the VCO may be determined. The frequency bands may include a first frequency band that has a band number that is lower and adjacent to a second frequency band. It may be determined whether a first output frequency of the VCO at a highest tuning voltage when the first frequency band is selected is greater than or equal to a second output frequency of the VCO at a lowest tuning voltage when the second frequency band is selected. The determination may be repeated with at least one new frequency band only if the first output frequency is greater than or equal to the second output frequency.

A monotonic error between the frequency bands in the VCO may also be determined where the frequency bands include a first frequency band that has a band number that is lower and adjacent to a second frequency band. It may be determined whether a second output frequency of the VCO at a medium tuning voltage when the second frequency band is selected is greater than or equal to a first output frequency of the VCO at the medium tuning voltage when the first frequency band is selected. The determination may be repeated with at least one new frequency band only if the second output frequency is greater than or equal to the first output frequency.

A frequency range error between the frequency bands in the VCO may be determined. The frequency bands may include a lowest frequency band in the VCO and a highest frequency band in the VCO. It may be determined whether a lowest output frequency of the VCO at a medium tuning voltage when the lowest frequency band is selected is less than or equal to a lowest target frequency. It may also be determined whether a highest output frequency of the VCO at a medium tuning voltage when the highest frequency band is selected is greater than or equal to a highest target frequency.

An apparatus for self testing a multiband VCO is also disclosed. The apparatus includes a multiband VCO. The output of the VCO does not affect the input to the VCO. The apparatus also includes a programmable tuning voltage generator that provides a tuning voltage output. The tuning voltage output is configured to adjust a tuning voltage of the VCO. The apparatus also includes a VCO built in self test controller that is in electronic communication with the programmable tuning voltage generator and the VCO. The VCO built in self test controller is configured to select frequency bands in the VCO and measure output frequencies of the VCO.

An apparatus for self testing a multiband VCO is also disclosed. The apparatus includes means for adjusting a tuning voltage of the VCO where the output of the VCO does not affect the input to the VCO. The apparatus also includes means for selecting frequency bands in the VCO. The apparatus also includes means for measuring output frequencies of the VCO.

A computer-program product for self testing a multiband VCO is also disclosed. The computer-program product includes a computer-readable medium having instructions thereon. The instructions include code for adjusting a tuning voltage of the VCO where the output of the VCO does not affect the input to the VCO. The instructions also include code for selecting frequency bands in the VCO. The instructions also include code for measuring output frequencies of the VCO.

An integrated circuit for self testing a multiband VCO is also disclosed. The integrated circuit is configured to adjust a tuning voltage of the VCO where the output of the VCO does not affect the input to the VCO. The integrated circuit is also configured to select frequency bands in the VCO. The integrated circuit is also configured to measure output frequencies of the VCO.

A processor is also disclosed. The processor is configured to adjust a tuning voltage of a VCO where the output of the VCO does not affect the input to the VCO. The processor is also configured to select frequency bands in the VCO. The processor is also configured to measure output frequencies of the VCO.

Multiband voltage controlled oscillators (VCO) are commonly used in integrated circuits in wireless devices. A VCO is a circuit where the frequency of the output is controlled by a voltage input. VCOs may be used in phase locked loops (PLLs) to generate stable signals at different frequencies. For example, radio frequency integrated circuits (RFICs) are widely used as frequency synthesizers. These RFICs often include VCOs with multiple banks since a frequency synthesizer with one bank may need a larger tuning sensitivity, Kvco, to cover all channels. This may generate higher phase noise.

Since VCOs are required to output signals in a given frequency range, the output frequency of multiband VCOs is often tested. The measurement of VCO frequency using automated test equipment (ATE), however, is often very difficult and expensive. Therefore, if ATE is used to overlap test, monotonic test, and/or range test a VCO, the testing may take a long time because it may be difficult to achieve enough accuracy in light of the very high testing frequencies of the VCO. This may mean higher testing costs. Previous attempts to solve this problem include testing Vtune voltage variation over multiple channels. However, this method may still require extensive testing time and may have very low fault coverage.

To reduce testing time and improve accuracy, automatic VCO built in self test (BIST) circuitry may be implemented in RFICs. The present systems and methods may include VCO BIST circuitry with a programmable Vtune voltage generator that may be integrated into coarse tuning circuitry. This may allow the VCO BIST circuitry and the coarse tuning circuitry to share many common blocks. We can measure VCO frequency overlap error between banks, measure VCO frequency monotony error, and measure VCO frequency range error. This may allow the ATE to perform measurements in parallel with other measurements to save testing time.

FIG. 1 is a block diagram illustrating a system 100 for self testing a multiband voltage controlled oscillator (VCO) 110 in an open loop configuration. In one configuration, the device under test (DUT) 104 may be a wireless device such as a mobile station or a base station. Alternatively, the DUT 104 may be a chip for use in a wireless device. In other configurations, the DUT 104 may not be a wireless device or part of a wireless device. The DUT 104 may include an integrated circuit 106. The integrated circuit 106 may include mixed signal circuitry. Mixed signal circuitry may be circuitry that includes both analog and digital circuitry. In one configuration, the integrated circuit 106 may include a control module 108 that performs one or more VCO 110 BISTs and/or coarse tunes the VCO 110. In other words, the control module 108 may combine the circuitry for the VCO 110 BISTs and coarse tuning to reduce costs associated with the integrated circuit 106. The control module 108 may include memory or have access to memory that includes data about the tuning range, frequency band overlap data, etc.

In one configuration, the system 100 may perform the BIST and store the VCO BIST results 112 and/or send the VCO BIST results 112 to the test equipment 102. As mentioned earlier, this may reduce or even eliminate the cost associated with the time-consuming and expensive real time monitoring often performed by ATE. Additionally, the test equipment 102 may monitor coarse tuning performed by the control module 108.

Figure 2:
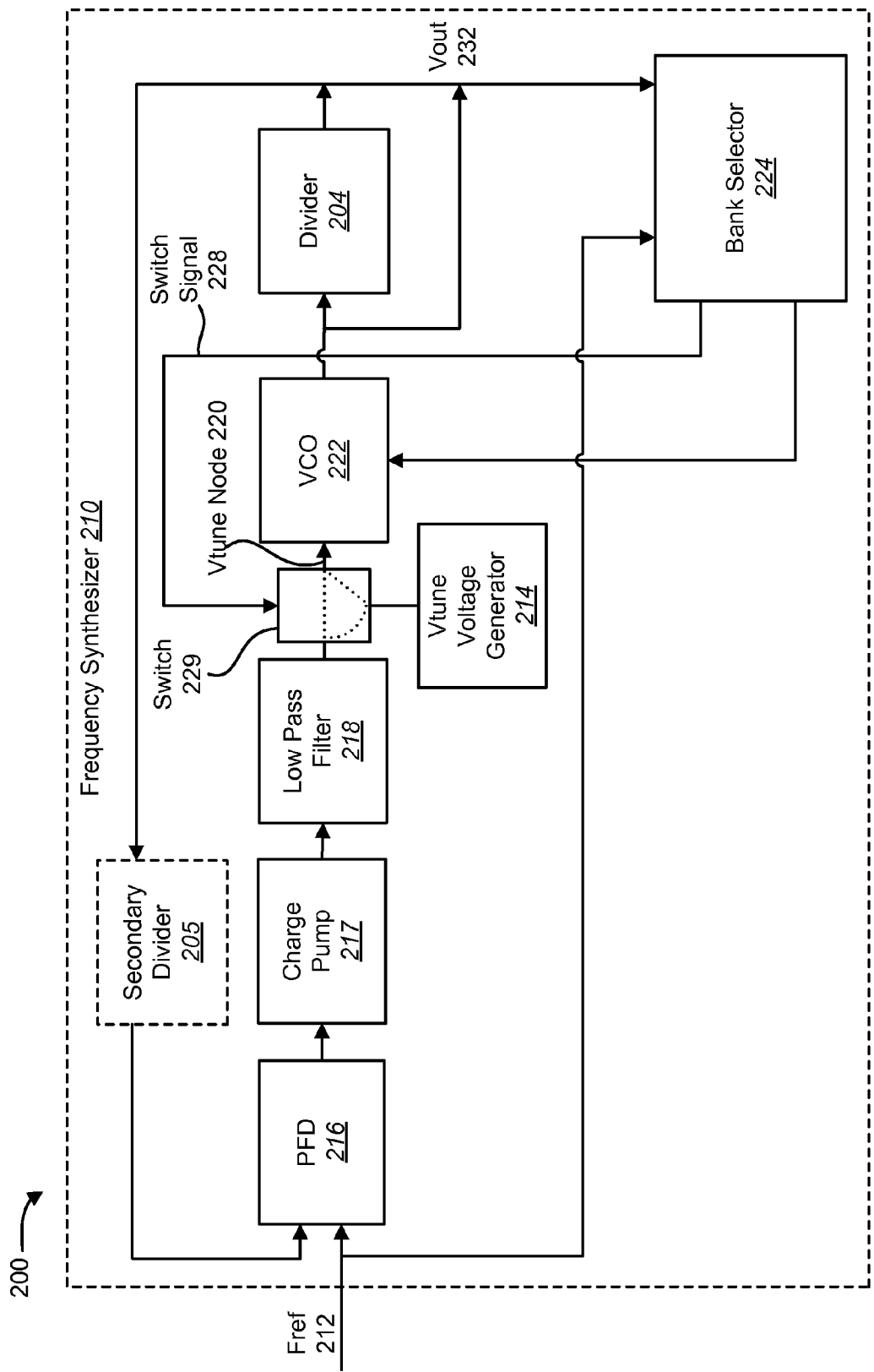
FIG. 2 is a block diagram illustrating a system for coarse tuning a multiband VCO that may be used with the present systems and methods.

FIG. 2 is a block diagram illustrating a system 200 for coarse tuning a multiband VCO 222 that may be used with the present systems and methods. In the illustrated configuration, a bank selector 224 may coarsely tune the VCO 222 before any fine tuning is performed. The system 200 may be implemented on a single integrated circuit 106 and may include various modules in a feedback configuration. Specifically, the system 200 may include a divider 204 placed in the feedback loop of a phase locked loop (PLL) to implement a frequency synthesizer 210 that is capable of generating a range of frequencies from a single fixed reference signal 212, e.g., oscillator. The divider 204 may be a frequency divider that divides the frequency of Vout 232 before it is fed back into the loop.

In one configuration during closed loop operation, a reference signal 212 with a predetermined frequency may be provided by a crystal oscillator and/or another suitable signal generator, from which the frequency synthesizer 210 may generate an output signal, Vout 232, that is fixed, i.e., locked, in frequency and/or phase to the reference signal 212. The frequency synthesizer 210 may also include a phase frequency detector (PFD) 216, a charge pump 217, a low pass filter 218, and one or more VCOs 222 operating in a closed feedback loop. Optionally, the frequency synthesizer 210 may also include an r-divider (not shown) that may alter the reference signal 212 prior to comparison at the PFD 216, e.g., divide the frequency of the reference signal 212.

Furthermore, the PFD 216 may compare the reference signal 212 to the output of the divider 204 in the feedback loop. The output of the divider 204 may be a signal with a frequency equal to the frequency of the output of the VCO 222 divided by an integer. Alternatively, the divider 204 may use a non-integer to divide the frequency of the VCO 222 output. The PFD 216 may determine any differences in phase and/or frequency between the output of the divider 204 and the reference signal 212 and express this difference as "pump up" or "pump down" pulses to the charge pump 217. The charge pump 217 may then provide charge to the low pass filter 218 that may filter the charge pump 217 output to the Vtune node 220. For example, the PFD 216 may generate a digital output signal consisting of high and/or low pulses of varying lengths. The charge pump 217 may receive this signal and produce an output corresponding to the pump up and/or pump down signals from the PFD 216. The charge pump 217 output may subsequently be filtered by the loop filter 218 to provide a stable voltage level to the VCO(s) 222.

The signals generated by the VCO 222 may optionally be reduced in frequency by an RF divider. Subsequently, the output of the VCO 222 may be divided by the divider 204 and then sent to the PFD 216 to complete the feedback loop. In one configuration, signals generated by the VCO 222 may continually be compared to the reference signal 212 to facilitate continuous adjustment of Vout 232 in relation to the reference signal 212. In this way, Vout 232 may eventually lock to a frequency that is specified by the equation:

$$Vout\_freq = (Fref\_freq/R) * N \quad (1)$$

where Vout_freq is the frequency of Vout 232, Fref_freq is the frequency of the reference signal 212, R is the parameter R used by the optional r-divider to divide the frequency of the reference signal 212, and N is the parameter N used by the divider 204 to divide the frequency of the output of the VCO 222. One example of an Fref_freq might be 80 MHz. For the purpose of illustration, assume there is no r-divider, i.e., R=1. Thus, the frequency of the output, Vout 232 may be described by:

$$Vout\_freq = Ref\_freq * N \quad (2)$$

Thus, the output of the frequency synthesizer 210, Vout 232, may lock to the reference frequency 212 multiplied by N.

In another configuration, the system 200 may operate in an open loop while coarse tuning the VCO 222. This configuration may not include VCO 222 BIST capability. The bank selector 224 may connect a Vtune voltage generator 214 to the Vtune node 220, using the Vtune switch signal 228, to provide a fixed medium tuning voltage (e.g., VDD/2). The bank selector 224 may communicate with a switch 229 that selectively connects either the Vtune voltage generator 214 or the low pass filter 218 to the Vtune node 220 based on the switch signal 228. The bank selector 224 may then receive the output of the divider 204, Vout 232, and measure the frequency of the VCO 222. The bank selector 224 may also change frequency bands in the VCO 222 until it finds the band with the closest frequency to a target frequency. In other words, the bank selector 224 may be responsible for coarsely tuning the VCO 222 so that the VCO 222 may reuse a tuning range over and over again, thus keeping the VCO 222 gain low. Without coarse tuning, the tuning sensitivity (Kvco) of a VCO 222 may be required to be high to tune the VCO 222 across the entire range of interest. This may cause detrimental effects in the performance of the system 200, e.g., higher phase noise. The VCO 222 may receive a signal from the bank selector 224 that indicates a bank number, e.g., 0-127. This signal may be $2^n$ bits, where n is the number of bank bits in the system 200. The VCO 222 may use the n bits to switch banks of capacitors in or out of a core LC circuit. In this way, different frequency bands may be selected. While it is appreciated that adjusting banks of capacitors changes the frequency band in a VCO 222, the terms "bank" and "band" may be used interchangeably herein to refer to the frequency bands in a VCO 222. As used herein, the term "bank" or "band" may refer to a particular frequency response of a VCO 222 for a range of tuning voltages. A VCO 222 may have multiple bands, each with a different frequency response. After the coarse tuning is finished, the bank selector 224 may switch the Vtune node 220 from the Vtune voltage generator 214 to the low pass filter 218 for fine tuning within a frequency band.

The preceding paragraphs describe Vout 232 as the output of the divider 204. In such a configuration, the system 200 may include a secondary divider 205 to provide a frequency to the PFD 216 that is higher than Fref 212. However, in another configuration, Vout 232 may be the output of the VCO 232 and the secondary divider 205 may not be needed. In other words, the bank selector 224 may receive the output of either the VCO 222 or the divider 204. The bank selector 224 may count the number of pulses in Vout 232 (i.e., the divider 204 output or the VCO 222 output) during a few cycles of Fref 212. The bank selector 224 may then compare the measured count number to the target count number when choosing the closest VCO 222 bank. In this way, the bank selector 224 input frequency may be higher than the reference clock 212 frequency and the bank selector 224 input, Vout 232, may be capable of making multiple pulses for one cycle of reference clock 212.

Figure 3:
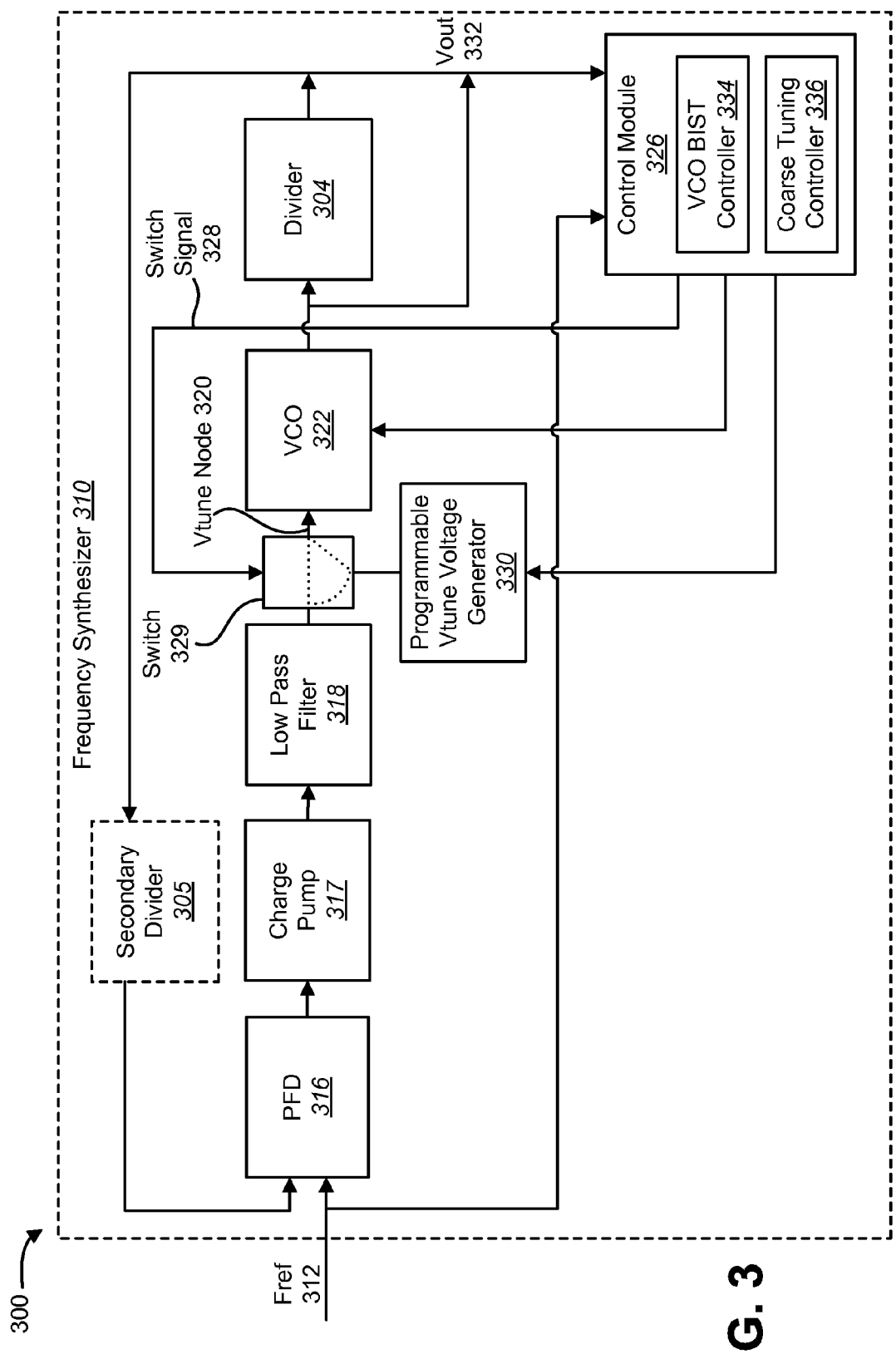
FIG. 3 is another block diagram of a system for self testing a multiband VCO in an open loop configuration.

FIG. 3 is another block diagram of a system 300 for self testing a multiband voltage controlled oscillator (VCO) 322 in an open loop configuration. One possible way to implement a VCO 322 BIST may be to have a closed loop configuration. In this configuration, Vtune may be defined by closed loop behavior where Vtune is taken from the output of the low pass filter 318. In other words, the input to the VCO 322 is affected by the output of the VCO 322, i.e., feedback. This may require a mechanism to measure the Vtune at any given time, e.g., an analog to digital converter (ADC). Furthermore, this may require waiting for the loop to settle before measuring the output of the VCO 322.

In contrast, the present systems and methods may use an open loop configuration to self test the multiband voltage controlled oscillator (VCO) 322. In other words, during the built in self test or coarse tuning, the Vtune node 320 may be disconnected from the output of the low pass filter 318 and connected to the programmable Vtune voltage generator 330 via the Vtune switch 329 that is controlled by a switch signal 328 from the control module 326. Put another way, output of the VCO 322 does not affect the input of the VCO 322. In this configuration, Vtune, as measured at the Vtune node 320, may be driven by the programmable Vtune voltage generator 330 rather than the output of the low pass filter 318. Then, when the built in self test or the coarse tuning is finished, the loop may be closed again by disconnecting the programmable Vtune voltage generator 330 and reconnecting the low pass filter 318, at which time the loop may operate as described above. One advantage of an open loop configuration may be that there is no need to wait for the loop to settle before changing Vtune or changing bands. For example, a closed loop system may have to wait after changing Vtune or changing bands before measuring the VCO 322 output. In contrast, the system 300 in an open loop configuration may not have to wait before measurement. This may reduce testing time and save money associated with testing. Additionally, a closed loop system may be required to measure Vtune during VCO 322 BISTs with additional circuitry. The present system 300, however, may already know the value of Vtune because the control module 326 may be controlling the output of the programmable Vtune voltage generator 330 during the VCO 322 BISTs and coarse tuning.

The system 300 may include many of the same modules as discussed above with the system 200 in FIG. 2, i.e., a frequency synthesizer 310 that uses an input signal Fref 312 to synthesize a signal Vout 332 of a particular frequency. Specifically, the PFD 316, charge pump 317, low pass filter 318, VCO 322, and divider 304 may function similarly to the PFD 216, charge pump 217, low pass filter 218, VCO 222, and divider 204 in FIG. 2, respectively. Additionally, the system 300 may include a VCO BIST controller 334 and a programmable Vtune voltage generator 330 to provide various and automatic VCO 322 BIST functions. In other words, the control module 326 may integrate a VCO BIST controller 334 and a coarse tuning controller 336 together in place of the bank selector 224. Additionally, the system 300 may add programmability to the Vtune voltage generator 214 to produce a programmable Vtune voltage generator 330 that may generate various Vtune voltages, e.g., VDD/10, VDD/5, VDD/2, etc. The VCO BIST controller 334 may measure the output frequency of the VCO 322 by counting pulses from the VCO 322. The output frequency of the VCO 322 may be measured by counting the number of pulses from the VCO 322. Using the known Vtune voltage, and the output frequency of the VCO 322, and the ability to change frequency bands, the VCO BIST controller 334 may perform automatic BISTs, e.g., frequency overlap testing, monotonic testing, and frequency range testing. Furthermore, this configuration may allow the VCO BIST controller 334 and coarse tuning controller 336 to share many common circuits and modules to save cost.

During coarse tuning, the coarse tuning controller 336 may set the Vtune voltage to half of the power supply (i.e., VDD/2) and check the VCO 322 output frequency by counting the number of pulses. Depending on the counted frequency, the coarse tuning controller 336 may continually change frequency bands until it finds the band with the closest frequency to a target frequency. During a VCO 322 BIST, the VCO BIST controller 334 may measure the frequency overlap between bands by changing the Vtune voltage and frequency band. One difference between coarse tuning circuitry and VCO 322 BIST circuitry may be the programmable Vtune voltage generator 330 for VCO 322 BIST. So, after adding the programmable Vtune voltage generator 330 to the system 300, the VCO BIST controller 334 may be easily integrated into the control module 326 with the coarse tuning controller 336 without much cost.

Similar to the system 200 illustrated in FIG. 2, the control module 326 may receive the divider 304 output or the VCO 322 output. If the control module 326 receives the divider output 304, the system 300 may include a secondary divider 305 to provide a frequency to the PFD 316 that is higher than Fref 312. However, in another configuration, Vout 332 may be the output of the VCO 332 and the secondary divider 305 may not be needed. The coarse tuning controller 336 may count the number of pulses in Vout 332 during a few cycles of Fref 312 and compare the measured count number to the target count number when choosing the closest VCO 322 bank. In this way, the control module 326 input frequency may be higher than the reference clock 312 frequency and the control module 326 input, Vout 332, may be capable of making multiple pulses for one cycle of reference clock 312.

Figure 4:
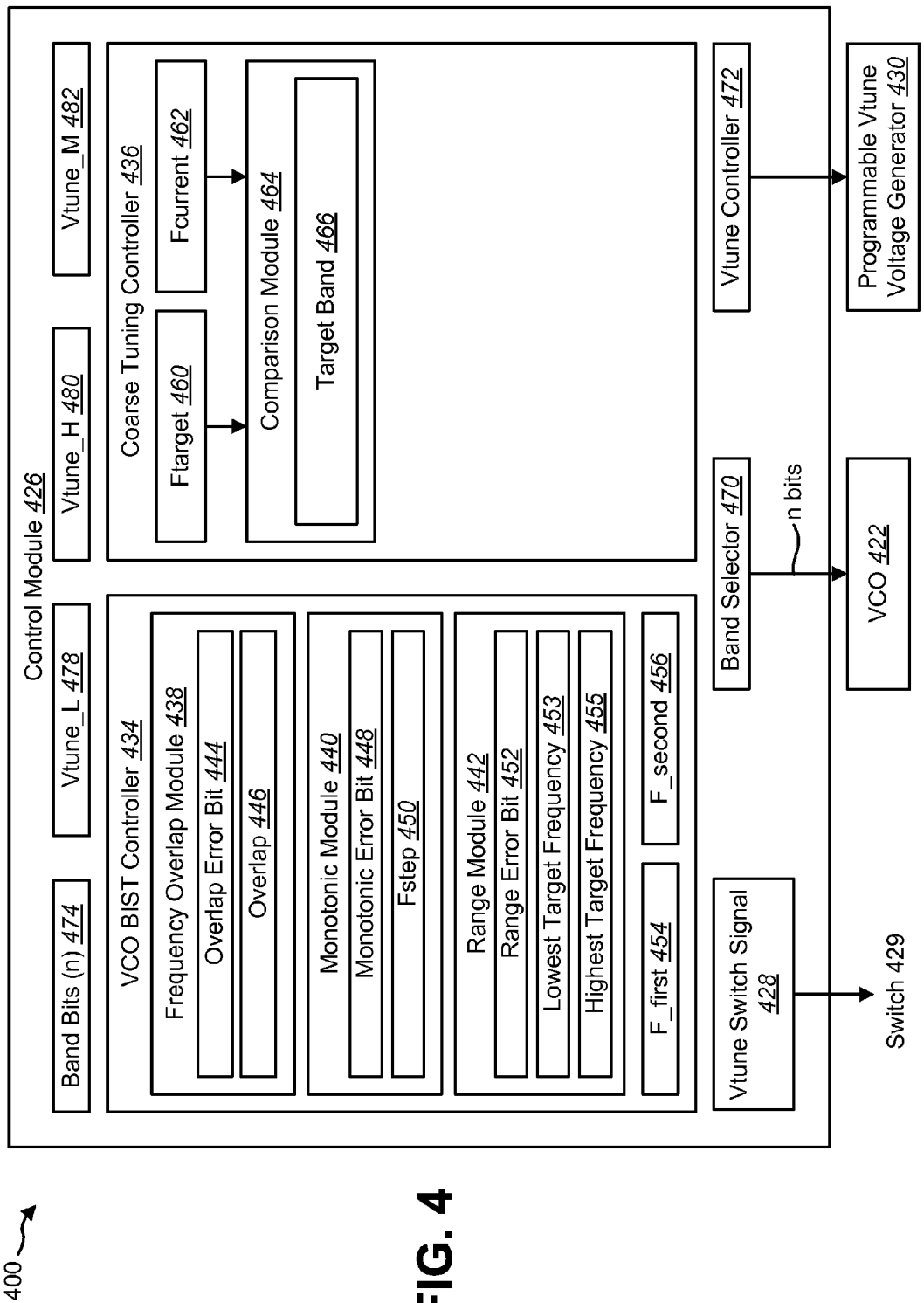
FIG. 4 is a block diagram of a system for self testing a multiband VCO in an open loop configuration.

FIG. 4 is a block diagram of a system 400 for self testing a multiband voltage controlled oscillator (VCO) 422 in an open loop configuration. The system 400 may include a control module 426 with three outputs, one for the Vtune switch 429, one for a VCO 422, and one for a programmable Vtune voltage generator 430. The control module 426 may include a VCO BIST controller 434 and a coarse tuning controller 436.

The VCO BIST controller 434 may include a module for each type of BIST that may be performed, e.g., a frequency overlap module 438 for frequency overlap testing, a monotonic module 440 for monotonic testing, and a range module 442 for range testing. During frequency overlap testing, one or more comparisons between two different frequency bands may be performed to determine the overlap 446 between the bands. In one configuration, every band may be tested against an adjacent band to determine whether there is sufficient overlap, i.e., whether the VCO 422 is continuously tunable over a particular range. F_first 454 may be the frequency within the lower of two bands. F_second 456 may be the frequency within the higher of two bands. For example, in the first comparison, F_first 454 may be the frequency of band 0 at Vtune_H 480 and F_second 456 may be the frequency of band 1 at Vtune_L 478. Then, overlap=F_first−F_second. If the overlap 446 is less than 0, the VCO 422 may not have enough overlap 446 between bands 0 and 1, and the overlap error bit 444 may be set and the VCO 422 may be identified as failing the overlap test. If the overlap 446 is greater than or equal to 0, the frequency overlap module 438 may repeat the comparison for the next couple of bands, e.g., band 1 and band 2. This may be repeated until either all bands have been tested or the overlap error bit 444 is set. Alternatively, the frequency overlap module 438 may perform a binary weighted frequency overlap BIST where only some of the bands are compared to an adjacent band. In other words, F_first 454 and F_second 456 may be defined in binary weighted frequency overlap testing as follows:

$$F\_first = 2^n - 2^i - 1 \tag{3}$$

$$F\_second = 2^n - 2^i \tag{4}$$

where i is an incrementing counter from 0 to n, and n 474 is the number of bits required to represent the number of bands in the VCO 422, i.e., the VCO 422 includes $2^n$ bands.

Vtune_L 478 may be the low tuning voltage limit and Vtune_H 480 may be the high tuning voltage limit for the VCO 422. Thus, Vtune_L 478 and Vtune_H 480 may represent the limits of the tuning range of the VCO 422 and may be defined based on charge pump 317 limitations. For example, and without limitation, Vtune_L 478 for charge pump 317 operation may be 300-400 mV and Vtune_H 480 may be 300-400 mV below the charge pump 317 supply rail.

The monotonic module 440 may perform similar comparisons. During monotonic testing, however, F_first 454 and F_second 456 may be measured at a medium Vtune voltage, Vtune_M 482, of adjacent bands, rather than at Vtune_H 480 and Vtune_L 478, respectively. Then, Fstep=F_second−F_first. If Fstep 450 is less than 0, the VCO 422 may not be monotonic, and the monotonic error bit 448 may be set and the VCO 422 may be identified as failing the monotonic test. If Fstep 450 is greater than or equal to 0, the monotonic module 440 may repeat the comparison for the next couple of bands, e.g., band 1 and band 2. This may be repeated until either all bands have been tested or the monotonic error bit 448 is set. Alternatively, the monotonic module 440 may perform binary weighted monotonic testing where only some of the bands are compared to an adjacent band.

Likewise, the range module 442 may perform similar comparisons. During range testing, F_first 454 may be may be the frequency of band 0 at Vtune_L 478 and F_second 456 may be the frequency of band $2^n-1$ (i.e., the highest band) at Vtune_H 480. Then, the range module 442 may determine whether F_first 454 is less than or equal to a lowest target frequency 453 and F_second 456 is greater than or equal to a highest target frequency 455. If F_first 454 is not less than or equal to the lowest target frequency 453 or F_second 456 is not greater than or equal to the highest target frequency 455, the range error bit 452 may be set and the VCO 422 may be identified as failing the range test. In other words, the VCO 422 may not be able to tune the targeted frequency range, defined between the lowest target frequency 453 and the highest target frequency 455, if F_first 454 is greater than the lowest target frequency 453 or F_second 456 is less than the highest target frequency 455.

The coarse tuning controller 436 may include a comparison module 464 that determines a target band 466 based on a target frequency 460 and the current frequency 462 of the VCO 422. In other words, during coarse tuning, the coarse tuning controller 436 may set the Vtune voltage to VDD/2 and check the current frequency 462 by counting the number of pulses output by the VCO 422. The coarse tuning controller 436 may communicate with a band selector 470 to continually change VCO 422 bands until it finds a target band 466 that has a frequency closest to the target frequency 460.

The control module 426 may also include a Vtune switch signal 428, a band selector 470, and a Vtune controller 472. The Vtune switch signal 428 may be sent to the Vtune switch 429 that is used to connect the programmable Vtune voltage generator 430 or the low pass filter 318 to the Vtune node 320. In other words, the Vtune switch signal 428 may be the mechanism by which the system 300 of FIG. 3 changes between an open loop configuration and a closed loop configuration. The band selector 470 may send a n-bit signal to the VCO 422 indicating the desired band. For example, during a BIST or coarse tuning, the VCO BIST controller 434 or coarse tuning controller 436 may desire to change frequency bands. The VCO BIST controller 434 or coarse tuning controller 436 may indicate this to the band selector 470 that may then relay the n-bit signal to the VCO 422 itself. Likewise, the Vtune controller 472 may receive indications about desired Vtune voltages from the VCO BIST controller 434 or coarse tuning controller 436 and send a signal to the programmable Vtune voltage generator 430. For example, the coarse tuning controller 436 may desire a Vtune of VDD/2 while the VCO BIST controller 434 may desire a Vtune of Vtune_L 478, Vtune_H 480, or Vtune_M 482.

Figure 5:
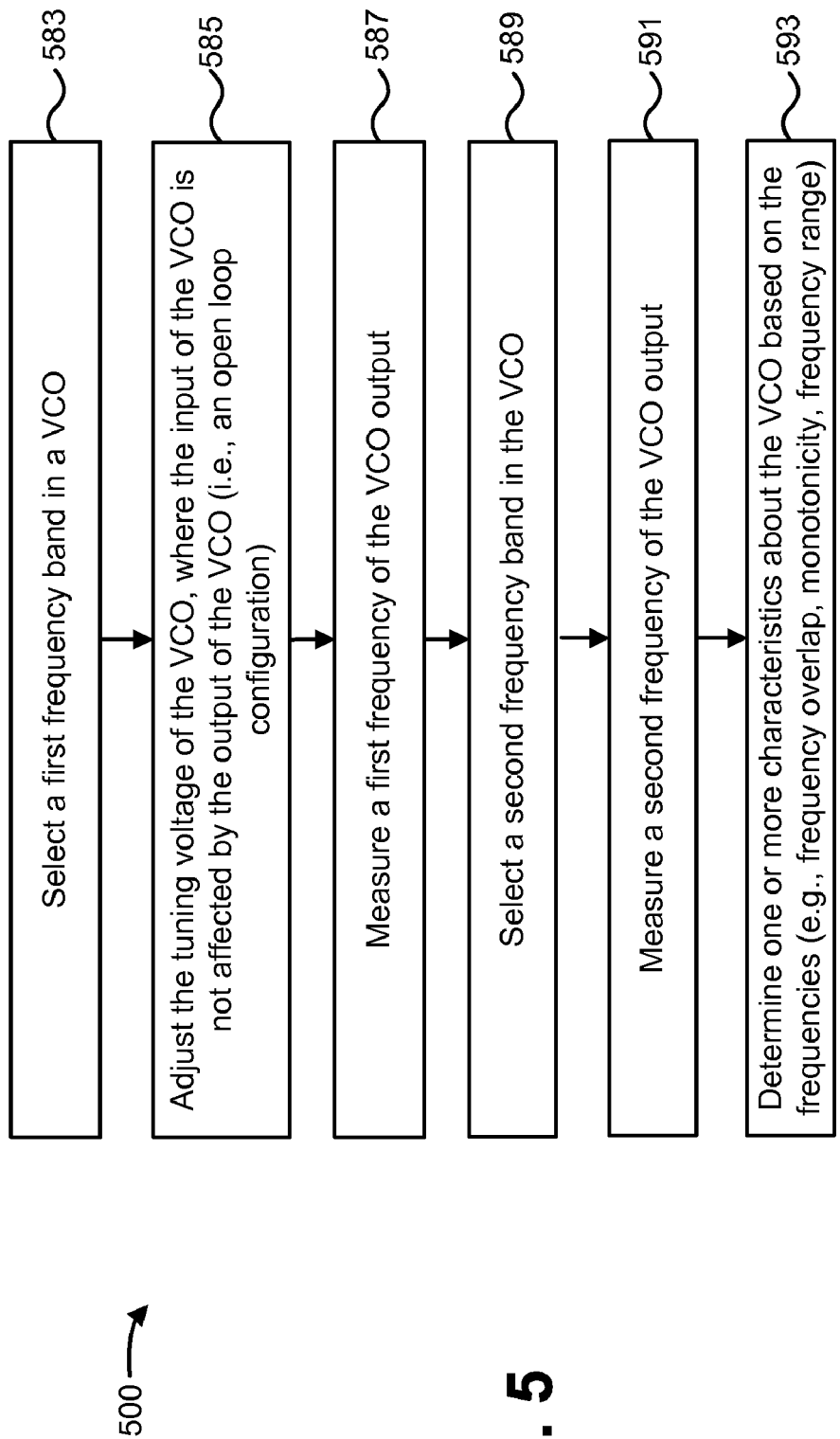
FIG. 5 is a flow diagram illustrating a method for self testing a VCO in an open loop configuration.

FIG. 5 is a flow diagram illustrating a method 500 for self testing a VCO 422 in an open loop configuration. The method 500 may be performed by a VCO BIST controller 434. The VCO BIST controller 434 may select 583 a first frequency band in a VCO 422. The VCO BIST controller 434 may also adjust 585 the tuning voltage of the VCO 422. For example, depending on the type of BIST (e.g., frequency overlap, monotonic, or frequency range), Vtune may be adjusted to the lowest tuning voltage, Vtune_L 478, the highest tuning voltage, Vtune_H 480, or a medium tuning voltage, Vtune_M 482. The VCO BIST controller 434 may also measure 587 a first frequency of the VCO 422 output, e.g., F_first 454. The VCO BIST controller 434 may also select 589 a second frequency band in the VCO 422. The second frequency band may be adjacent to and have a higher number than the first frequency band. The VCO BIST controller 434 may also measure 591 a second frequency of the VCO 422 output, e.g., F_second 456. The VCO BIST controller 434 may also determine 593 one or more characteristics about the VCO 422 based on the first frequency, F_first 454, and the second frequency, F_second 456. For example, during a frequency overlap BIST, the characteristic may be the overlap 446 between the frequency bands, e.g., overlap=F_first−F_second. During a monotonic BIST, the Fstep 450 between the two frequency bands may be determined, e.g., Fstep=F_second−F_first. During a frequency range BIST, the VCO BIST controller 434 may ensure that F_first 454 is less than or equal to the lowest target frequency 453 of the VCO 422 and that F_second 456 is greater than or equal to the highest target frequency 455 of the VCO 422. One or more of the steps may be repeated if only if the characteristics meet a minimum threshold. In other words, the adjusting, selecting, measuring, and determining may be performed only if the overlap 446 is greater than or equal to zero in a frequency overlap BIST. Likewise, the adjusting, selecting, measuring, and determining may be performed only if Fstep 450 is greater than or equal to zero in a monotonic BIST. Likewise, in a frequency range BIST, the the adjusting, selecting, measuring, and determining may be performed only if F_first 454 is less than or equal to the lowest target frequency 453 of the VCO 422 and that F_second 456 is greater than or equal to the highest target frequency 455 of the VCO 422.

Figure 5A:
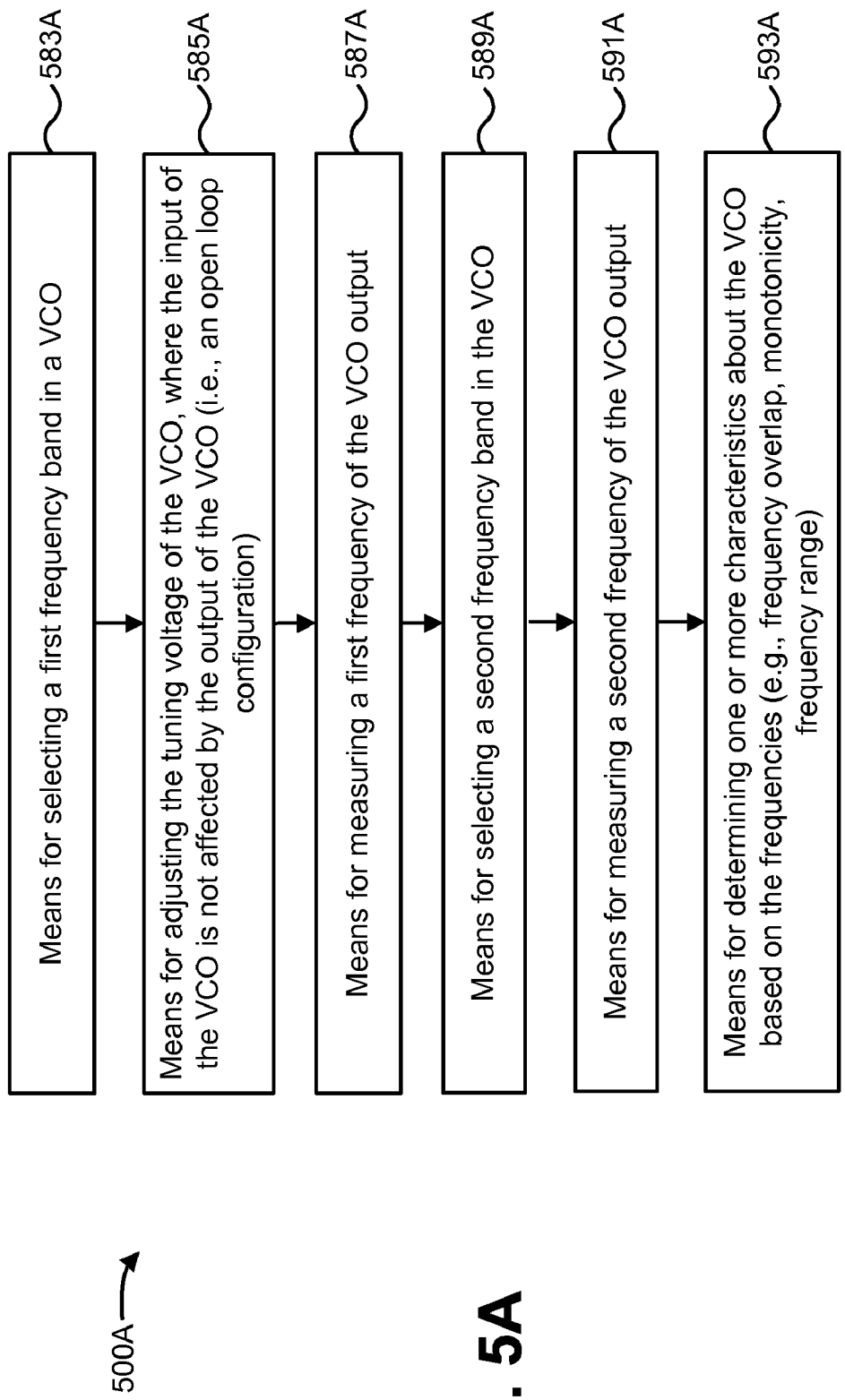
FIG. 5A illustrates means-plus-function blocks corresponding to the method of FIG. 5.

The method 500 of FIG. 5 described above may be performed by various hardware and/or software component(s) and/or module(s) corresponding to the means-plus-function blocks 500A illustrated in FIG. 5A. In other words, blocks 583 through 593 illustrated in FIG. 5 correspond to means-plus-function blocks 583A through 593A illustrated in FIG. 5A.

Figure 6:
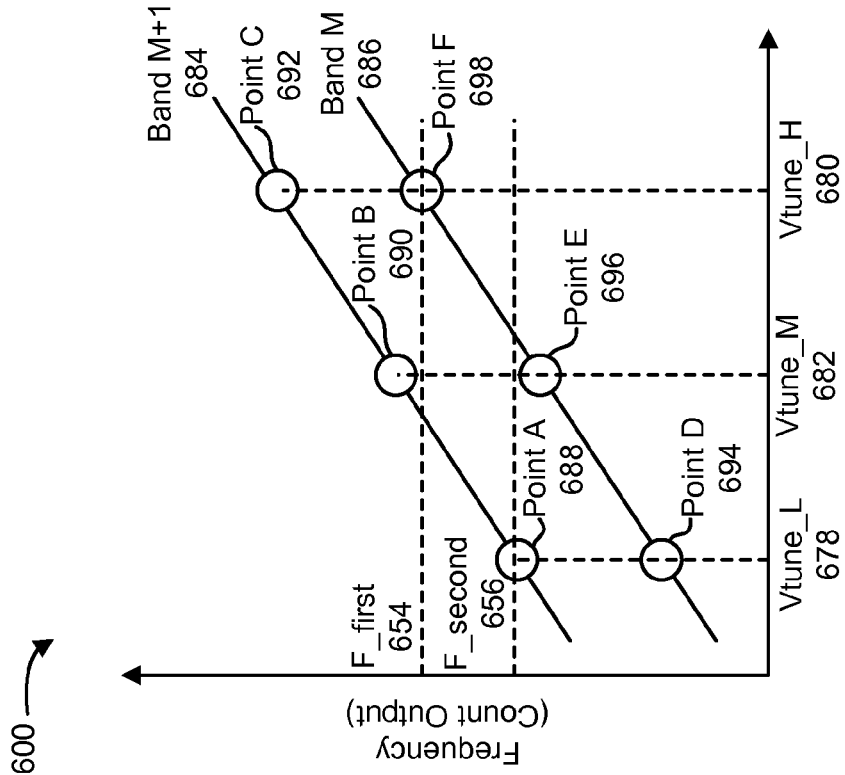
FIG. 6 is a plot showing the frequency of the output of a multiband VCO versus the tuning voltage input during a VCO built in self test.

FIG. 6 is a plot showing the frequency of the output of a multiband VCO 422 versus the tuning voltage input during a VCO 422 built in self test. A frequency synthesizer 310 with multiple banks may have frequency overlaps 446 between banks as illustrated in the plot 600. If there is no overlap between two bands in a VCO 422, the VCO 422 may not be able to generate correct frequency within the required band. This frequency non-overlapping may be checked with a VCO 422 BIST to select bad samples. Furthermore, some applications require that monotonic behavior in the VCO 422 output frequency be tested before sampling. Also, an additional test may check whether a VCO 422 (e.g., on a chip) has enough frequency range to cover the target range or not.

The plot 600 is shown for a VCO 422 with M+1 frequency bands. The diagonal lines in the plot 600 represent the frequency response of Vout 332 in response to changes in the Vtune voltage. Point A 688, point B 690, and point C 692 may represent points on band (M+1) 684 for Vtune values of Vtune_L 678, Vtune_M 682, and Vtune_H 680, respectively. Point D 694, point E 696, and point F 698 may represent points on band M 686 for Vtune values of Vtune_L 678, Vtune_M 682, and Vtune_H 680, respectively.

In the plot 600, a gap between bands may represent a frequency range that cannot be achieved by the VCO 422. The bands illustrated in the plot 600 have no gaps, i.e., there is enough overlap 446 between the bands. To identify VCOs 422 with gaps in them, a system 400 may perform one or more VCO 422 BISTs. During overlap testing, the overlap 446 may be defined as the frequency of point F 698 (i.e., F_first 654) minus the frequency of point A 688 (i.e., F_second 656). If the overlap 446 is greater than or equal to zero, as illustrated in the plot 600, band (M+1) 684 and band M 686 may not have any gaps between them, i.e., the bands have sufficient overlap 446. During monotonic testing, Fstep 450 may be defined as the frequency of point B 690 minus the frequency of point E 696. If the Fstep 450 is greater than or equal to zero, band (M+1) 684 and band M 686 may be considered monotonic. Thus, the bands illustrated in the plot 600 are monotonic. Alternatively, the frequencies of point A 688 and point D 694 or the frequencies of point C 692 and point F 698 may be used for monotonic testing. In other words, monotonic testing may utilize any two corresponding points in two bands as long as they are measured at the same Vtune value, e.g., Vtune_L 678, Vtune_M 682, or Vtune_H 680. For the purpose of illustrating range testing, assume that band (M+1) 684 is the highest band and band M 686 is the lowest band in a VCO 422. During range testing, the frequency of point B 690 may be compared to a highest target frequency 455 and the frequency of point E 696 may be compared to a lowest target frequency 453. If the frequency of point B 690 is greater than or equal to the highest target frequency 455 and the frequency of point E 696 is less than or equal to the lowest target frequency 453, the VCO 422 may be able to tune across the entire target frequency range. Alternatively, the frequency of point C 692 and the frequency of point D 694 may be used for frequency range testing.

Figure 7:
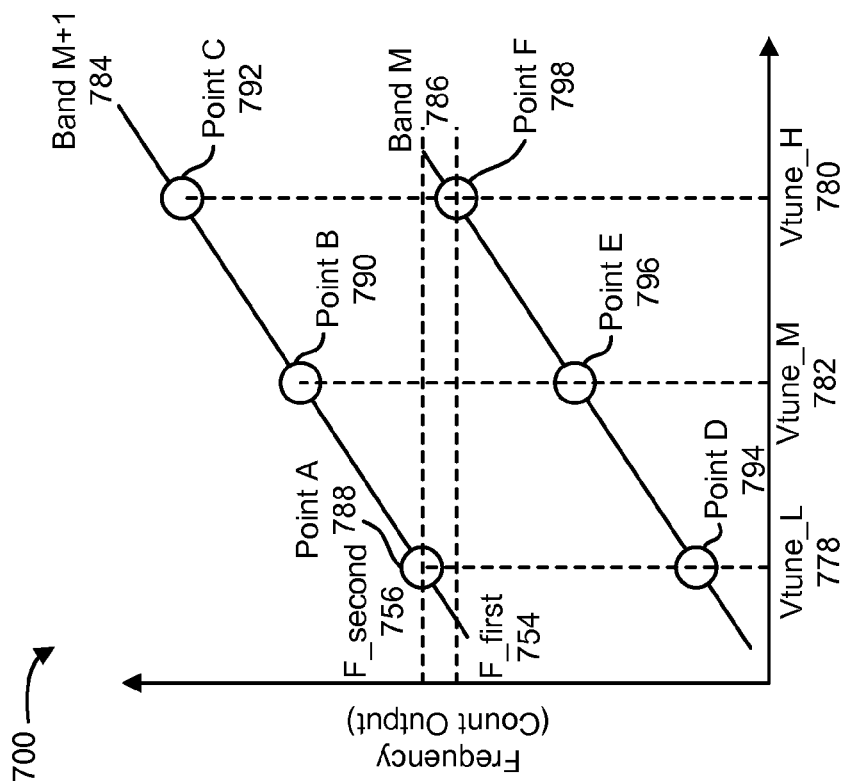
FIG. 7 is another plot showing the frequency of the output of a multiband VCO versus the tuning voltage input during a VCO built in self test.

FIG. 7 is another plot 700 showing the frequency of the output of a multiband VCO 422 versus the tuning voltage input during a VCO 422 built in self test. As before, the plot 700 is shown for a VCO 422 with M+1 frequency bands. Point A 788, point B 790, and point C 792 may represent points on band (M+1) 784 for Vtune values of Vtune_L 778, Vtune_M 782, and Vtune_H 780, respectively. Point D 794, point E 796, and point F 798 may represent points on band M 786 for Vtune values of Vtune_L 778, Vtune_M 782, and Vtune_H 780, respectively.

Unlike the plot 600 in FIG. 6, however, the bands illustrated in the plot 700 in FIG. 7 have a gap between them, i.e., there is not enough overlap 446 between the bands. During overlap testing, the overlap 446 may be defined as the frequency of point F 798 (i.e., F_first 754) minus the frequency of point A 788 (i.e., F_second 756). Since the overlap 446 is negative (i.e., less than zero), the overlap error bit 444 may be set and the VCO 422 may be identified as failing the overlap test.

Figure 8:
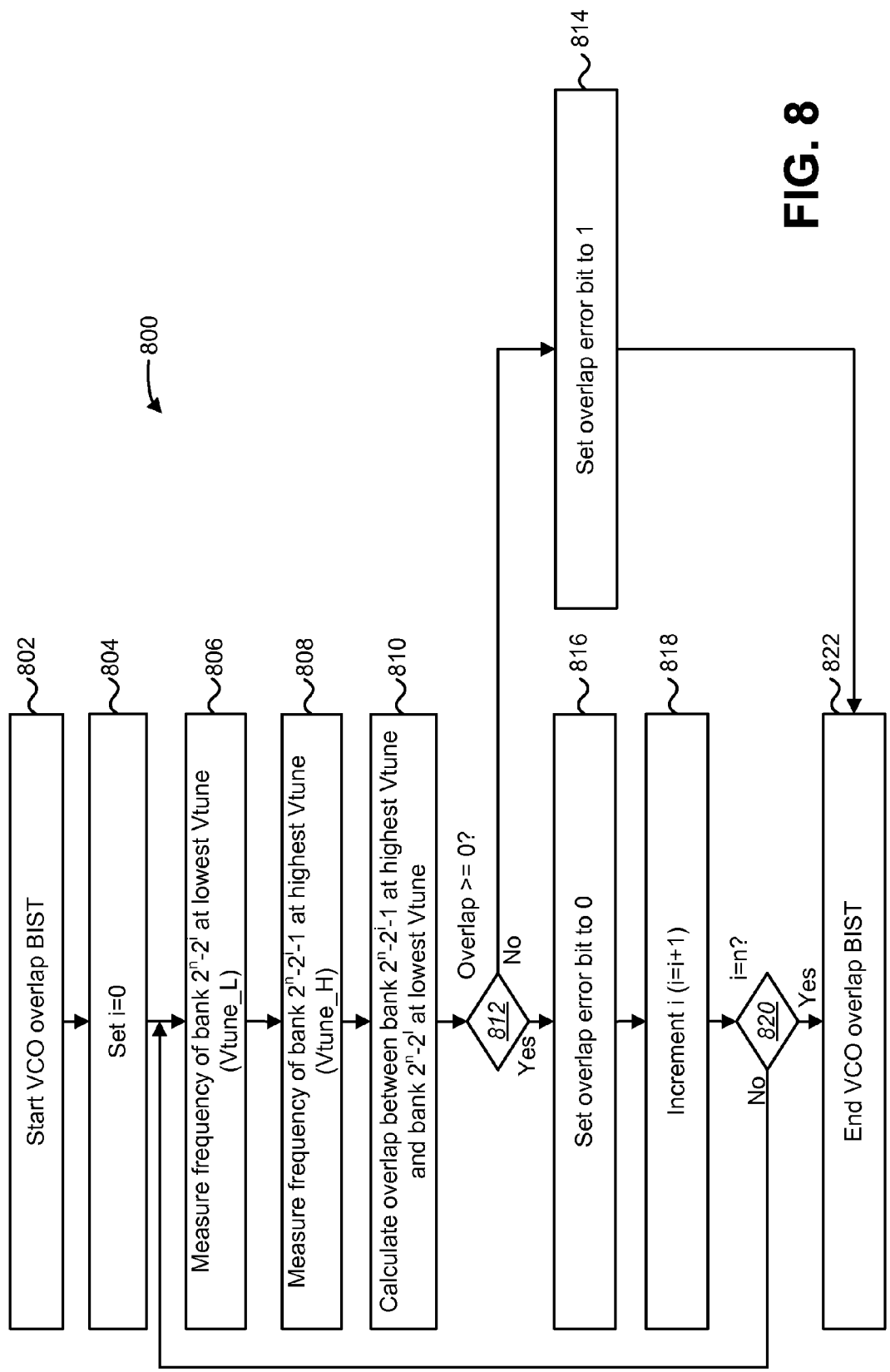
FIG. 8 is a flow diagram illustrating a method for a binary weighted VCO built in self test to check the frequency overlap error between banks.

FIG. 8 is a flow diagram illustrating a method 800 for a binary weighted VCO 422 built in self test to check the frequency overlap error between banks The method 800 may be performed by a VCO BIST controller 434. The method 800 may also include parameters i and n, where i is an incrementing counter, and n 474 is the number of bits required to represent the number of bands in the VCO 422, i.e., the VCO 422 includes $2^n$ bands.

After the method 800 starts 802, i may be set 804 to zero. The method 800 may measure 806 F_second 456 as the VCO 422 output frequency of bank $(2^n-2^i)$ at Vtune_L 478. The method 800 may also measure 808 F_first 454 as the VCO 422 output frequency of bank $(2^n-2^i-1)$ at Vtune_H 480. The method 800 may also calculate 810 an overlap 446 between bank $(2^n-2^i-1)$ at Vtune_H 480 and bank $(2^n-2^i)$ at Vtune_L 478. In other words, overlap=F_first−F_second. The method 800 may also determine 812 whether the overlap 446 is greater than or equal to zero. If the overlap 446 is not greater than or equal to zero, the method 800 may set 814 an overlap error bit 444 to 1 and end 822. If, however, the overlap 446 is greater than or equal to zero, the method 800 may set 816 the overlap error bit 444 to zero and increment 818 i. The method 800 may then determine 820 if i=n. If i=n, the method 800 may end 822. If i does not equal n, the method 800 may begin for the new value of i. In other words, the method 800 may return to step 806 only if the first output frequency, F_first 454, is greater than or equal to the second output frequency, F_second 456.

As an example, and without limitation, assume n=7 (i.e., the VCO 422 has seven bits for banks), which means the VCO includes 128 banks from bank 0 to bank 127. Then the binary weighted method 800 may start to check overlap errors from the least significant bit (LSB). During the binary weighted VCO 422 BIST, the VCO BIST controller 434 may measure 806 the VCO 422 output frequency of bank 127 at Vtune_L 478 and measure 808 the VCO 422 output frequency of bank 126 at Vtune_H 480. The VCO BIST controller 434 may also check whether the frequency of bank 127 is lower than the frequency of bank 126. Bank 127 and bank 126 may be compared first because i may be zero and $(2^7-2^0=127)$ and $(2^7-2^0-1=126)$. In other words, the overlap 446 may be calculated 810 and it may be determined 812 whether the overlap 446 is greater than or equal to zero. If no, the VCO BIST controller 434 may set 814 the overlap error bit 444 to one and end 822 the method 800. If yes, the VCO BIST controller 434 may check the frequency overlap 446 between bank 126 and bank 125 at which the LSB+1 is switched. In other words, during the first iteration of the method the LSB may be the $0^{th}$ bit, so bank 127 (expressed as 1111111 in binary) may be compared to bank 126 (expressed as 1111110 in binary), e.g., the LSB is switched. The next iteration, if performed, may compare bank 126 (expressed as 1111110 in binary) with bank 125 (expressed as 1111101 in binary), i.e., the LSB+1 bit ($1^{st}$ bit) is switched. After checking those banks, VCO BIST controller 434 may check the overlap 446 between bank 124 (expressed as 1111100 in binary) and bank 123 (expressed as 1111011 in binary), i.e., the LSB+2 ($2^{nd}$) bit is switched. The VCO BIST controller 434 may then check the overlap 446 between bank 120 and bank 119, e.g., the LSB+3 bit ($3^{rd}$ bit) is switched, and so on. The binary weighted method 800 may reduce testing time since it only tests the switching of each VCO bank bit, not every possible overlap 446 in the VCO 422.

Figure 8A:
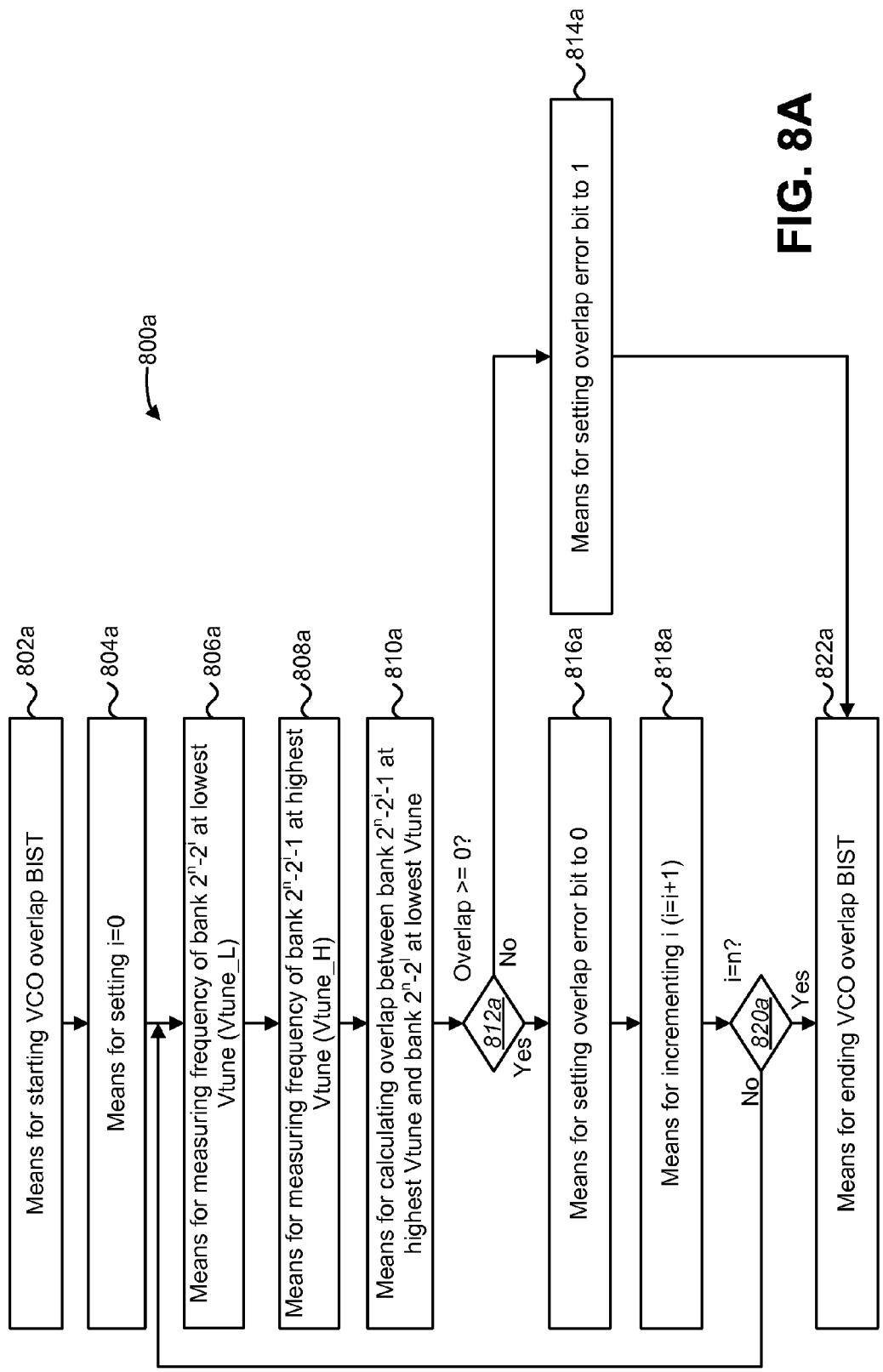
FIG. 8A illustrates means-plus-function blocks corresponding to the method of FIG. 8.

The method 800 of FIG. 8 described above may be performed by various hardware and/or software component(s) and/or module(s) corresponding to the means-plus-function blocks 800A illustrated in FIG. 8A. In other words, blocks 802 through 822 illustrated in FIG. 8 correspond to means-plus-function blocks 802A through 822A illustrated in FIG. 8A.

Figure 9:
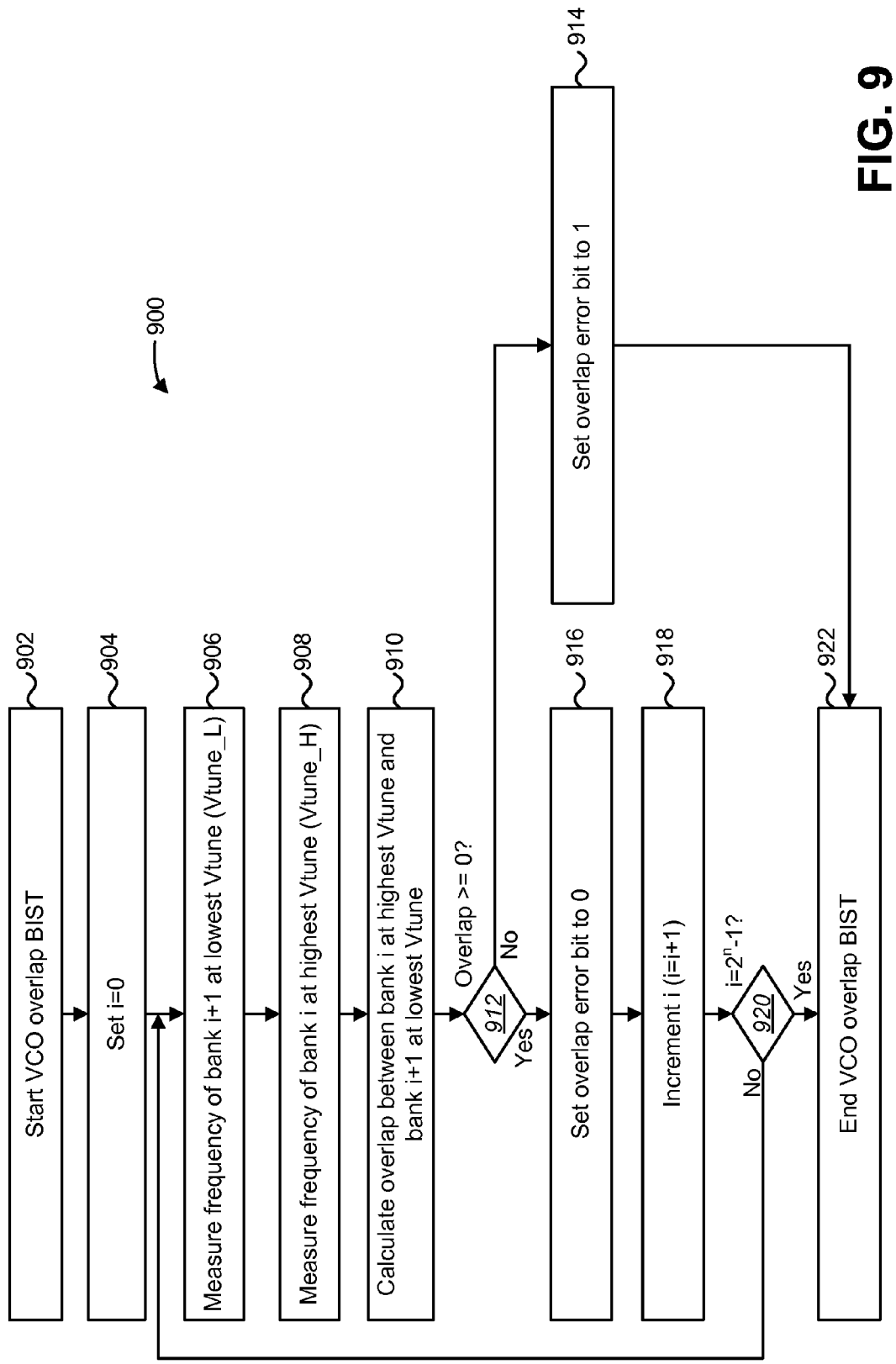
FIG. 9 is a flow diagram illustrating a method for a linear weighted VCO built in self test to check the frequency overlap error between banks.

FIG. 9 is a flow diagram illustrating a method 900 for a linear weighted VCO 422 built in self test to check the frequency overlap error between banks The method 900 may be performed by a VCO BIST controller 434. In this method 900, the VCO BIST controller 434 may check the overlap 446 from bank 0 to bank 127, i.e., all the bands may be tested. This method 900 may have full error coverage over banks even though it may take much more testing time.

After the method 900 starts 902, i may be set 904 to zero. The method 900 may measure 906 F_second 456 as the VCO 422 output frequency of bank i+1 at Vtune_L 478. The method 900 may also measure 908 F_first 454 as the VCO 422 output frequency of bank i at Vtune_H 480. The method 900 may also calculate 910 an overlap 446 between bank i at Vtune_H 480 and bank i+1 at Vtune_L 478. In other words, overlap=F_first−F_second. The method 900 may also determine 912 whether the overlap 446 is greater than or equal to zero. If the overlap 446 is not greater than or equal to zero, the method 900 may set 914 an overlap error bit 444 to 1 and end 922. If, however, the overlap 446 is greater than or equal to zero, the method 900 may set 916 the overlap error bit 444 to zero and increment 918 i. The method 900 may then determine 920 if i=$2^n$−1. If i=$2^n$−1, the method 900 may end 922. If i does not equal $2^n$−1, the method 900 may begin for the new value of i. In other words, the method 900 may return to step 906 only if the first output frequency, F_first 454, is greater than or equal to the second output frequency, F_second 456.

Figure 9A:
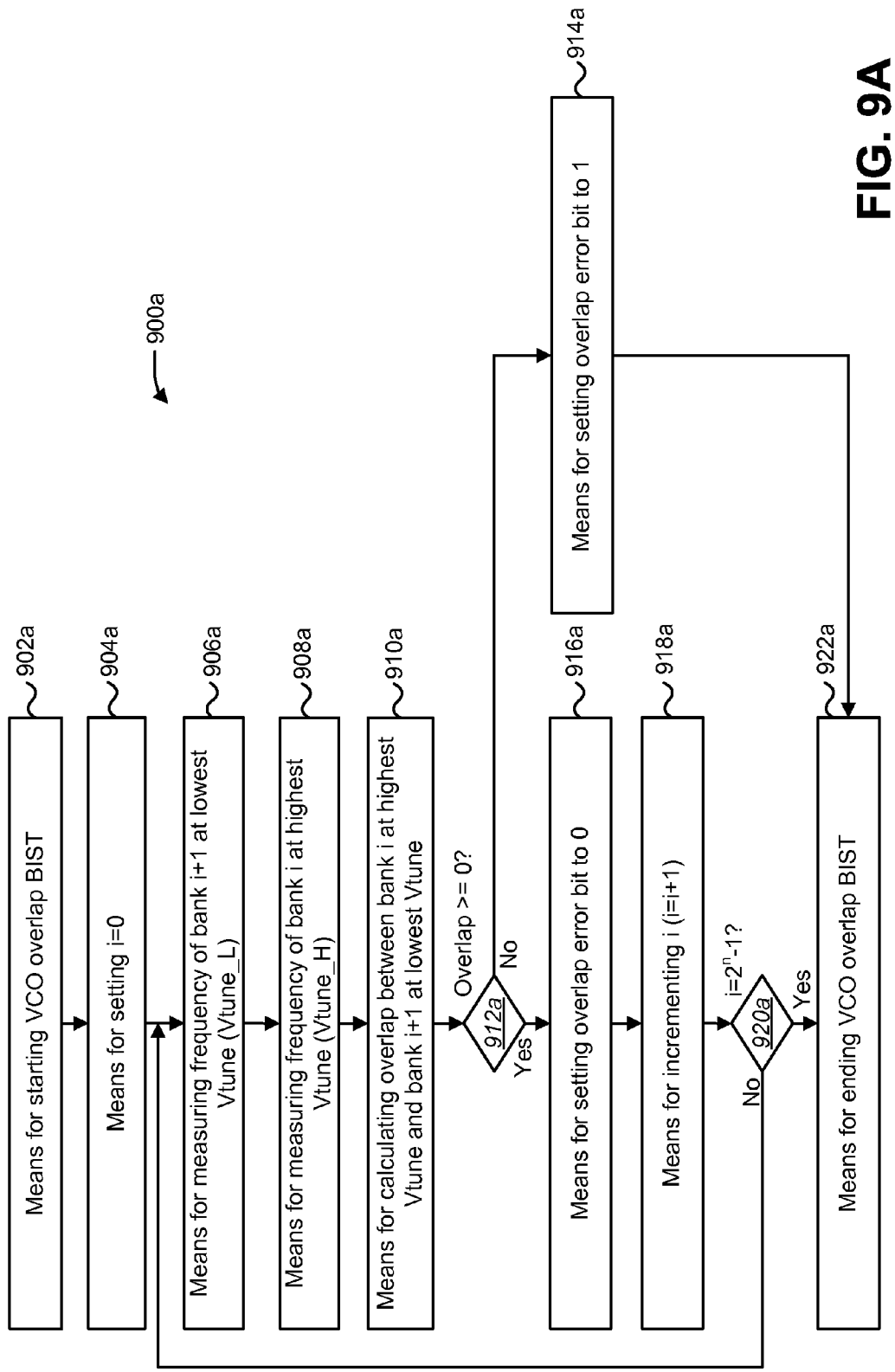
FIG. 9A illustrates means-plus-function blocks corresponding to the method of FIG. 9.

The method 900 of FIG. 9 described above may be performed by various hardware and/or software component(s) and/or module(s) corresponding to the means-plus-function blocks 900A illustrated in FIG. 9A. In other words, blocks 902 through 922 illustrated in FIG. 9 correspond to means-plus-function blocks 902A through 922A illustrated in FIG. 9A.

Figure 10:
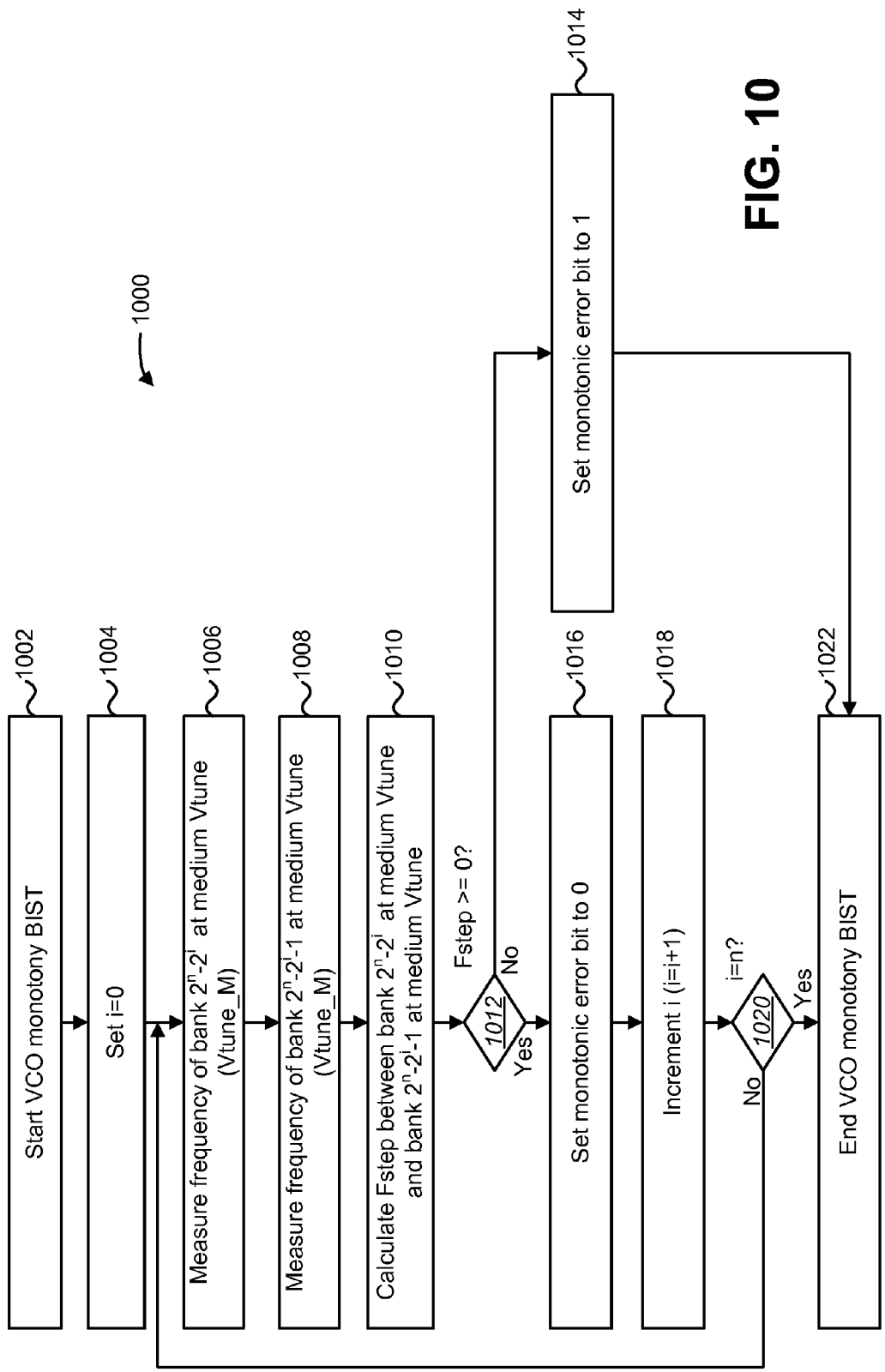
FIG. 10 is a flow diagram illustrating a method for a binary weighted VCO built in self test to check the monotonic error between banks.

FIG. 10 is a flow diagram illustrating a method 1000 for a binary weighted VCO 422 built in self test to check the monotonic error between banks The method 1000 may be performed by a VCO BIST controller 434. The method 1000 may also check the frequency monotonic error when the binary bank bits are switched as described with the binary weighted overlap BIST method 800 in FIG. 8.

After the method 1000 starts 1002, i may be set 1004 to zero. The method 1000 may measure 1006 F_second 456 as the VCO 422 output frequency of bank ($2^n-2^i$) at Vtune_M 482. The method 1000 may also measure 1008 F_first 454 as the VCO 422 output frequency of bank ($2^n-2^i-1$) at Vtune_M 482. The method 1000 may also calculate 1010 an Fstep 450 between bank ($2^n-2^i-1$) at Vtune_M 482 and ($2^n-2^i$) at Vtune_M 482. In other words, Fstep=F_second−F_first. The method 1000 may also determine 1012 whether the Fstep 450 is greater than or equal to zero. If Fstep 450 is not greater than or equal to zero, the method 1000 may set 1014 a monotonic error bit 448 to 1 and end 1022. If, however, Fstep 450 is greater than or equal to zero, the method 1000 may set 1016 the monotonic error bit 448 to zero and increment 1018 i. The method 1000 may then determine 1020 if i=n. If i=n, the method 1000 may end 1022. If i does not equal n, the method 1000 may begin for the incremented value of i. In other words, the method 1000 may return to step 1006 only if the second output frequency, F_second 456, is greater than or equal to the first output frequency, F_first 454.

Figure 10A:
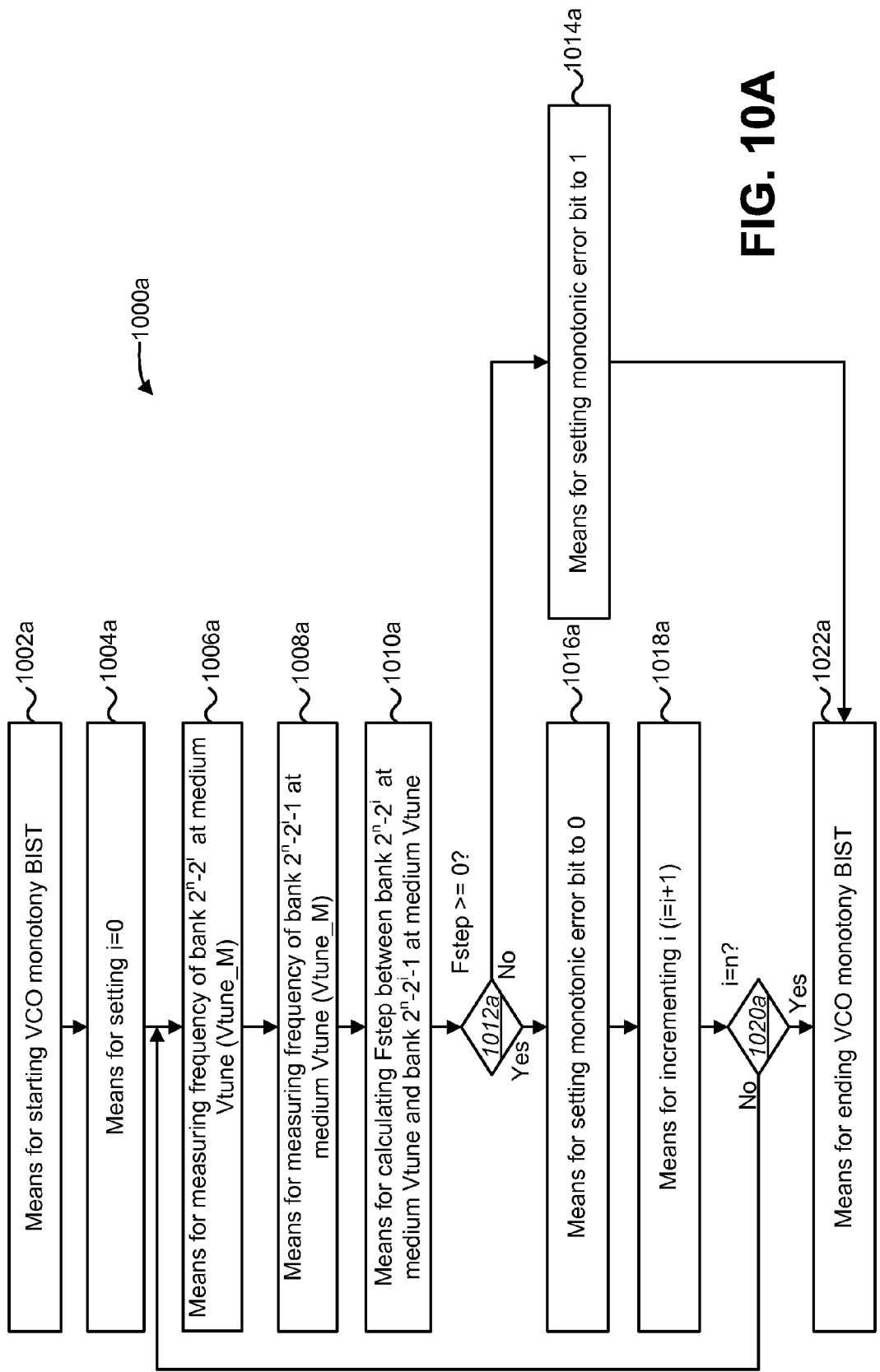
FIG. 10A illustrates means-plus-function blocks corresponding to the method of FIG. 10.

The method 1000 of FIG. 10 described above may be performed by various hardware and/or software component(s) and/or module(s) corresponding to the means-plus-function blocks 1000A illustrated in FIG. 10A. In other words, blocks 1002 through 1022 illustrated in FIG. 10 correspond to means-plus-function blocks 1002A through 1022A illustrated in FIG. 10A.

Figure 11:
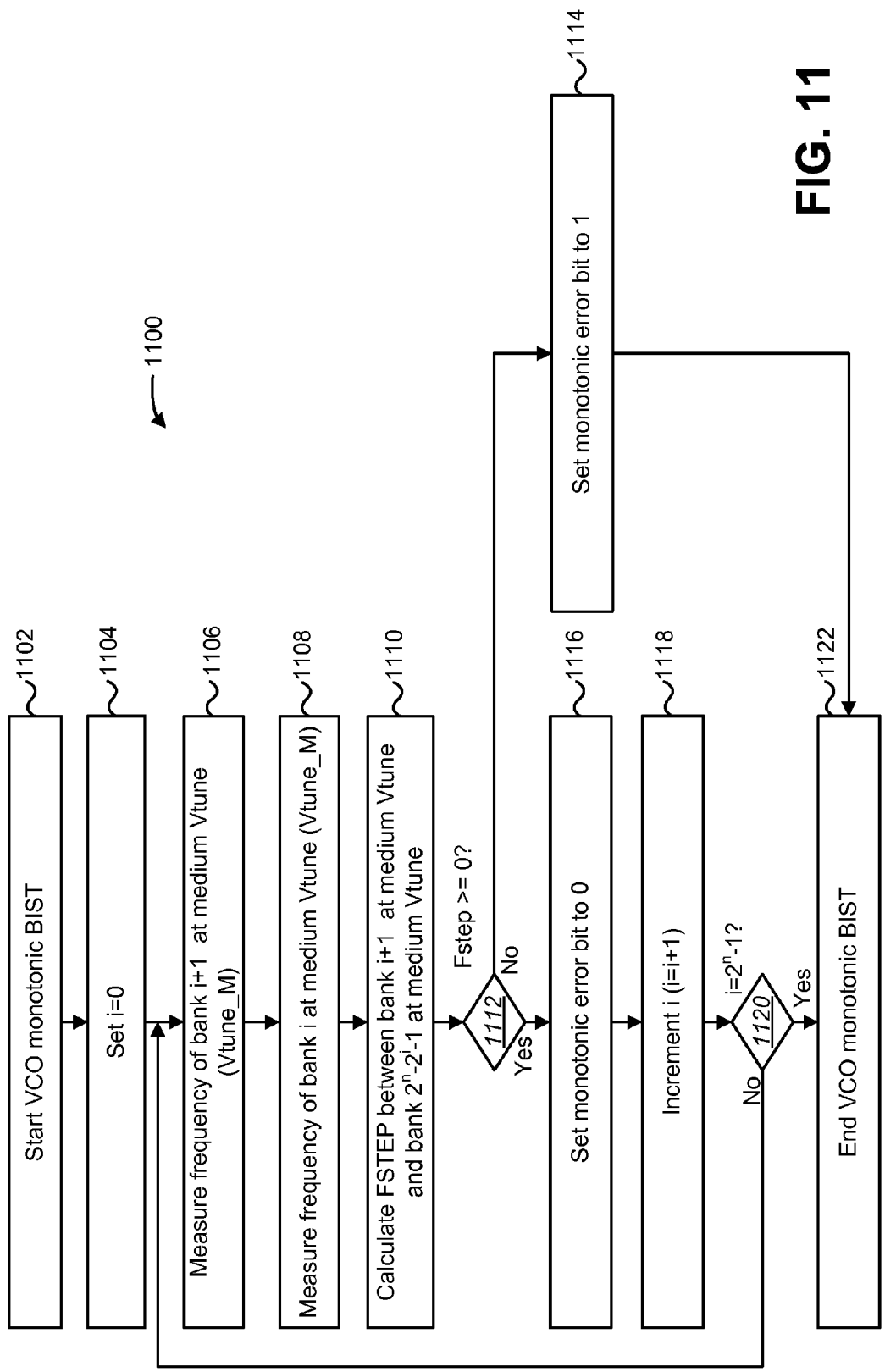
FIG. 11 is a flow diagram illustrating a method for a linear weighted VCO built in self test to check the monotonic error between banks.

FIG. 11 is a flow diagram illustrating a method 1100 for a linear weighted VCO 422 built in self test to check the monotonic error between banks The method 1100 may be performed by a VCO BIST controller 434. In this method 1100, the VCO BIST controller 434 may check the monotonic error from bank 0 to bank 127, i.e., all the bands may be tested. This method 1100 may have full error coverage over banks even though it may take much more testing time.

After the method 1100 starts 1102, i may be set 1104 to zero. The method 1100 may measure 1106 F_second 456 as the VCO 422 output frequency of bank i+1 at Vtune_M 482. The method 1100 may also measure 1108 F_first 454 as the VCO 422 output frequency of bank i at Vtune_M 482. The method 1100 may also calculate 1110 an overlap 446 between bank i at Vtune_M 482 and bank i+1 at Vtune_M 482. In other words, Fstep=F_second−F_first. The method 1100 may also determine 1112 whether Fstep 450 is greater than or equal to zero. If Fstep 450 is not greater than or equal to zero, the method 1100 may set 1114 a monotonic error bit 448 to 1 and end 1122. If, however, Fstep 450 is greater than or equal to zero, the method 1100 may set 1116 the monotonic error bit 448 to zero and increment 1118 i. The method 1100 may then determine 1120 if i=$2^n-1$. If i=$2^n-1$, the method 1100 may end 1122. If i does not equal $2^n-1$, the method 1100 may begin for the new value of i. In other words, the method 1100 may return to step 1106 only if the second output frequency, F_second 456, is greater than or equal to the second output frequency, F_first 454.

Figure 11A:
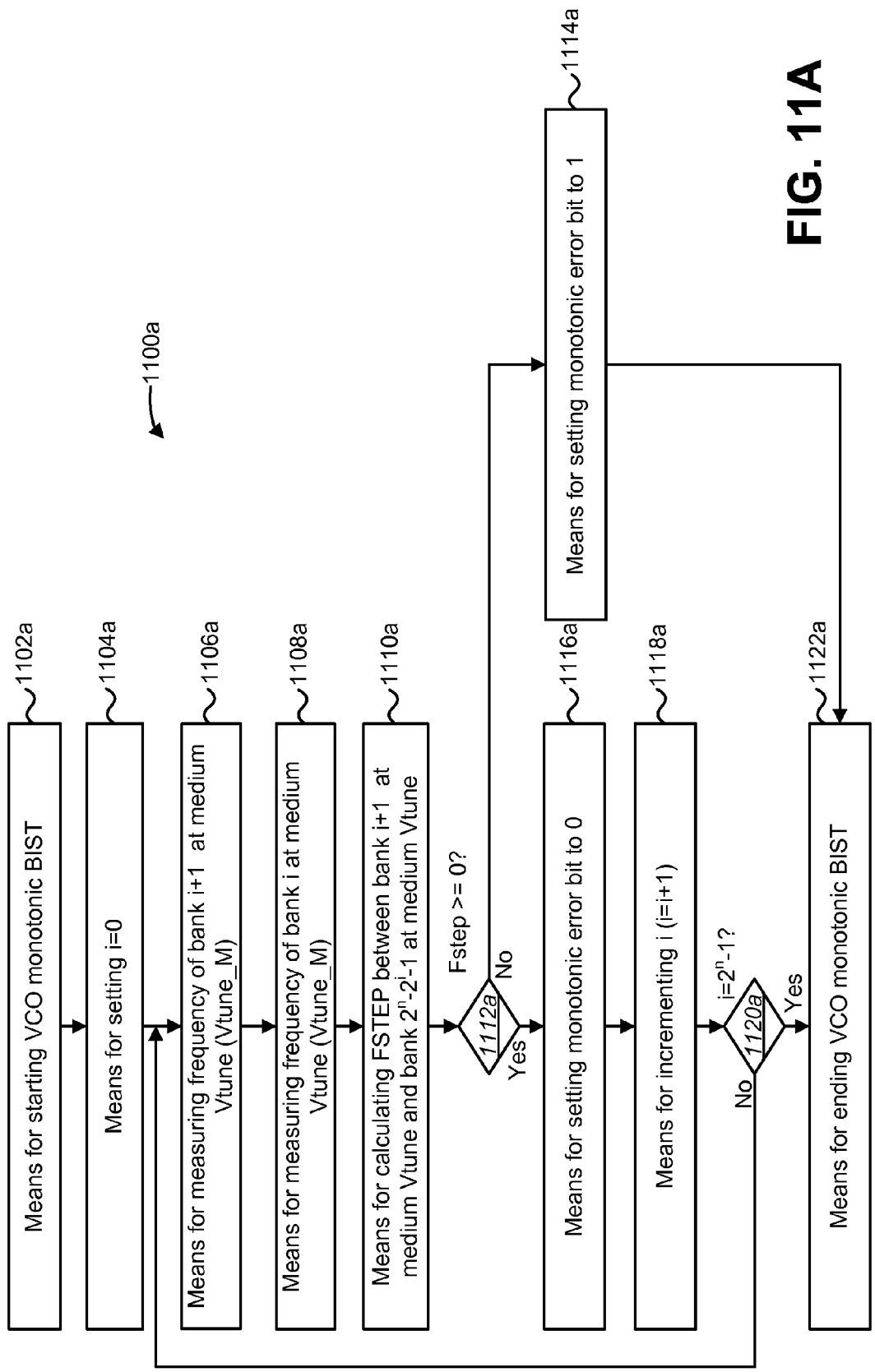
FIG. 11A illustrates means-plus-function blocks corresponding to the method of FIG. 11.

The method 1100 of FIG. 11 described above may be performed by various hardware and/or software component(s) and/or module(s) corresponding to the means-plus-function blocks 1100A illustrated in FIG. 11A. In other words, blocks 1102 through 1122 illustrated in FIG. 11 correspond to means-plus-function blocks 1102A through 1122A illustrated in FIG. 11A.

Figure 12:
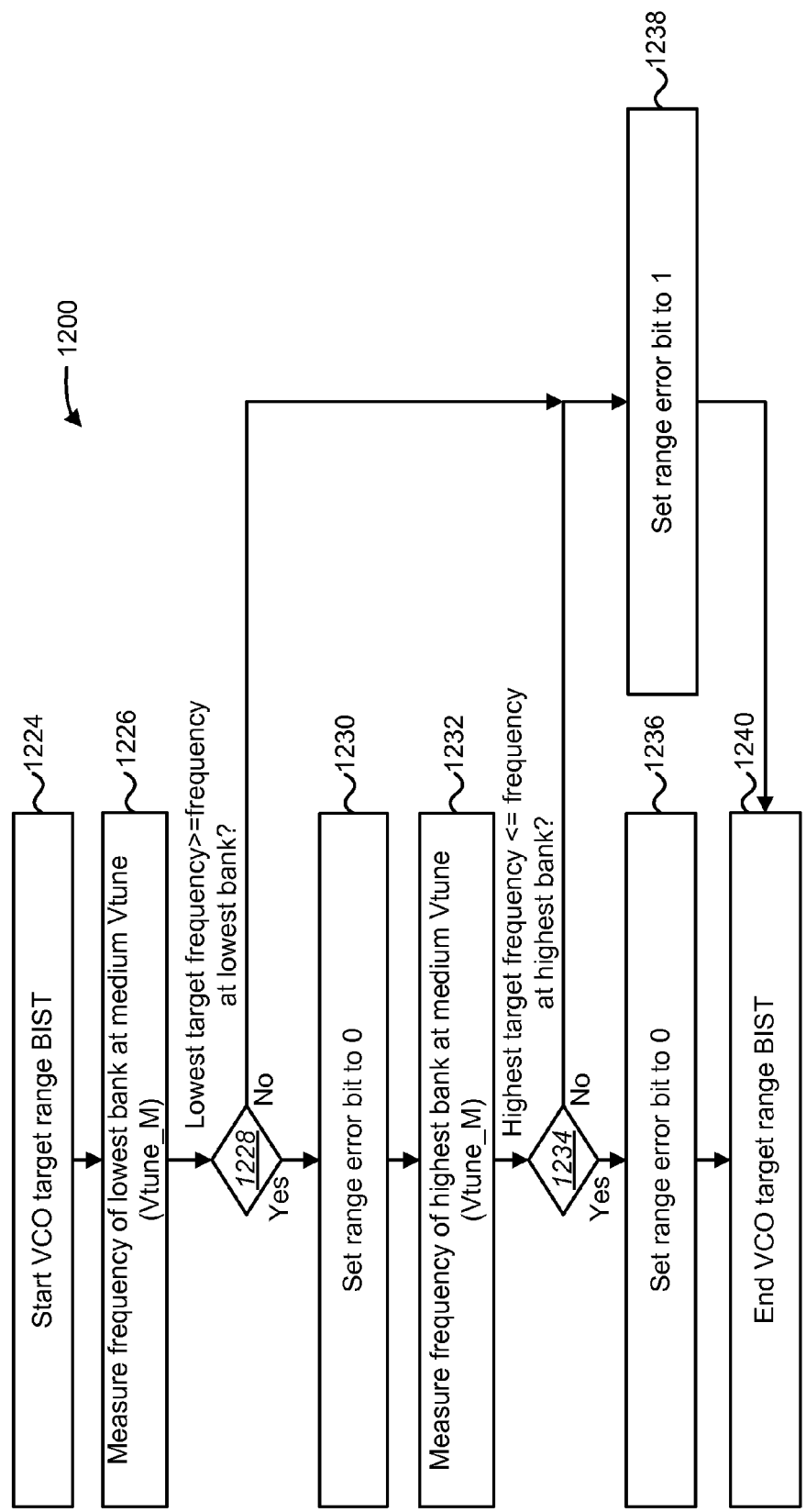
FIG. 12 is a flow diagram illustrating a method for a VCO built in self test to check the frequency range error.

FIG. 12 is a flow diagram illustrating a method 1200 for a VCO 422 built in self test to check the frequency range error. A VCO BIST controller 434 may use the method 1200 to check whether a VCO 422 (e.g., on a chip) has enough frequency range to cover a target frequency range. After the method 1200 starts 1224, the method 1200 may measure 1226 F_first 454 as the VCO 422 output frequency at the lowest bank at Vtune_M 482. The method 1200 may also compare 1228 F_first 454 to the lowest target frequency 453. If F_first 454 is not less than or equal to the lowest target frequency 453, the method 1200 may set 1238 a range error bit 452 to one and end 1240. However, if the lowest target frequency 453 is greater than or equal to F_first 454, the method 1200 may set 1230 the range error bit 452 to zero. The method 1200 may then measure 1232 F_second 456 as the VCO 422 output frequency at the highest bank at Vtune_M 482. The method 1200 may also compare 1234 F_second 456 to the highest target frequency 455. If F_second 456 is not greater than or equal to the highest target frequency 455, the method 1200 may set 1238 the range error bit 452 to one and end 1240. However, if F_second 456 is greater than or equal to the highest target frequency 455, the method 1200 may set 1236 the range error bit 452 to zero before ending 1240. Therefore, if the frequency of the lowest bank (i.e., F_first 454) is higher than the lowest target frequency 453 or the frequency of the highest bank (i.e., F_second 456) is lower than the highest target frequency 455, then the VCO BIST controller 434 may set the range error bit 452 to 1.

Figure 12A:
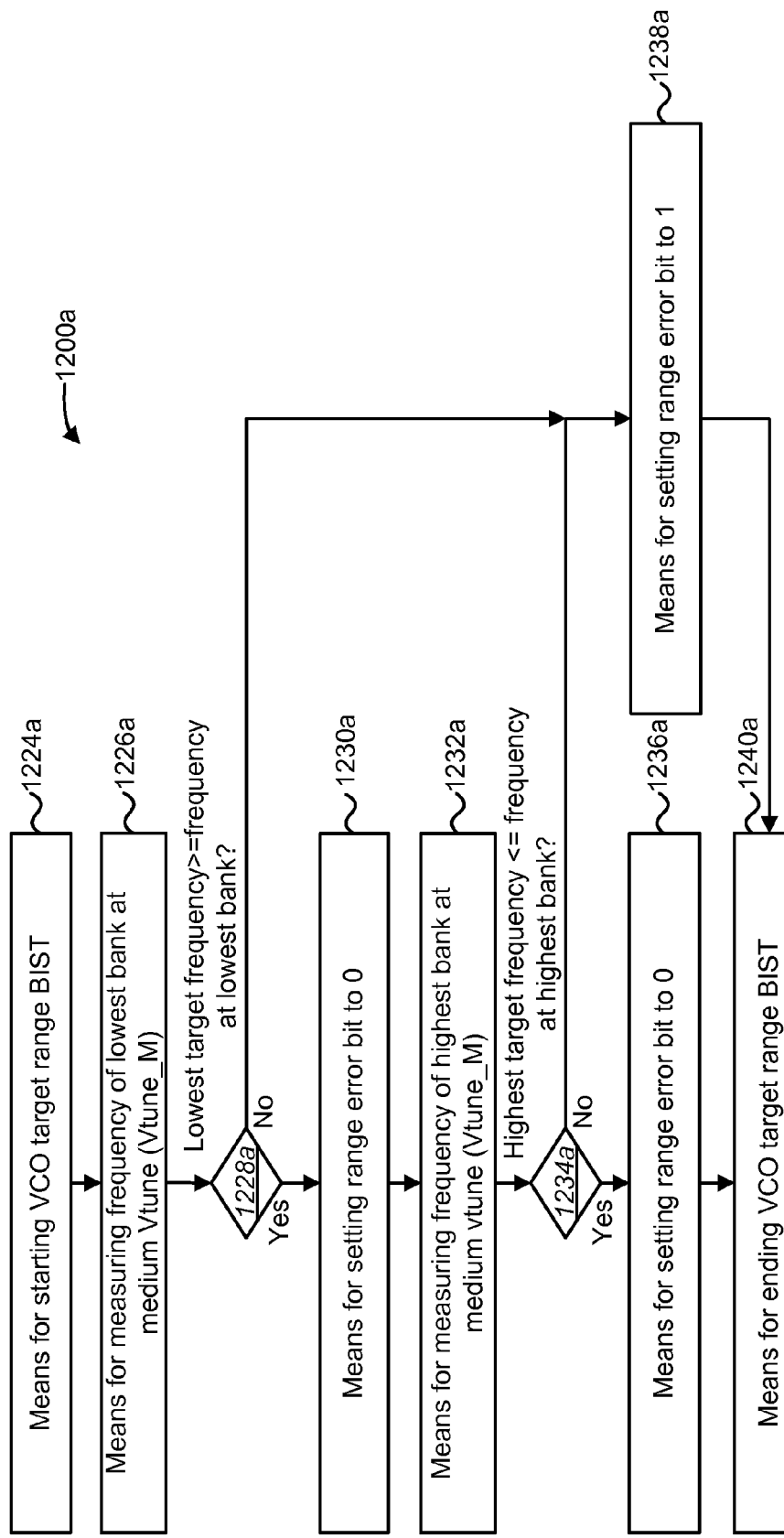
FIG. 12A illustrates means-plus-function blocks corresponding to the method of FIG. 12.

The method 1200 of FIG. 12 described above may be performed by various hardware and/or software component(s) and/or module(s) corresponding to the means-plus-function blocks 1200A illustrated in FIG. 12A. In other words, blocks 1224 through 1240 illustrated in FIG. 12 correspond to means-plus-function blocks 1224A through 1240A illustrated in FIG. 12A.

Figure 13:
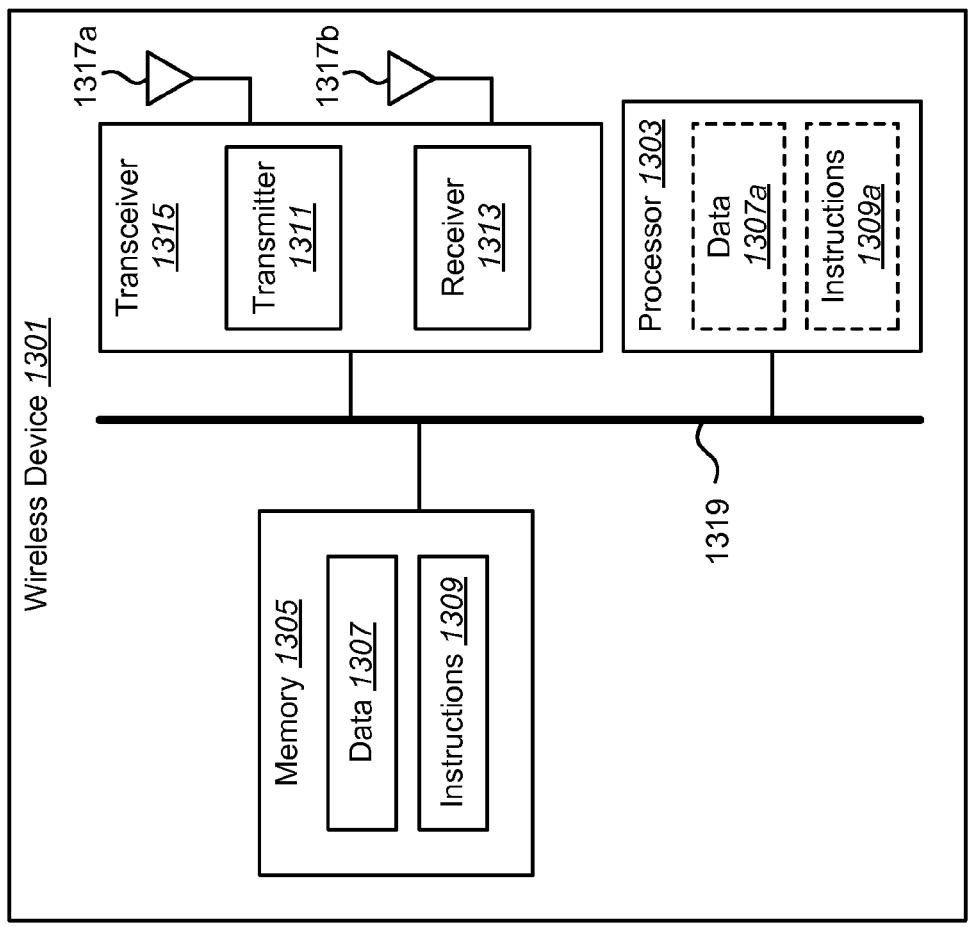
FIG. 13 illustrates certain components that may be included within a wireless device.

FIG. 13 illustrates certain components that may be included within a wireless device 1301. The wireless device 1301 may be a mobile device/station or a base station, i.e., an access point. Examples of mobile stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc. The present systems and methods may be used on an integrated circuit 106 that may be part of a wireless device 1301. Additionally, the present systems and methods may be used on an integrated circuit 106 that may be an electronic device that is not a wireless device 1301. However, the electronic device block diagram and components would be similar to the wireless device 1301 of FIG. 13 except that the electronic device may not have a transceiver 1315.

The wireless device 1301 may include a processor 1303. The processor 1303 may be a general purpose single- or multi-chip microprocessor (e.g., an ARM), a special purpose microprocessor (e.g., a digital signal processor (DSP)), a microcontroller, a programmable gate array, etc. The processor 1303 may be referred to as a central processing unit (CPU). Although just a single processor 1303 is shown in the wireless device 1301 of FIG. 13, in an alternative configuration, a combination of processors (e.g., an ARM and DSP) could be used.

The wireless device 1301 also includes memory 1305. The memory 1305 may be any electronic component capable of storing electronic information. The memory 1305 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1307 and instructions 1309 may be stored in the memory 1305. The instructions 1309 may be executable by the processor 1303 to implement the methods disclosed herein. Executing the instructions 1309 may involve the use of the data 1307 that is stored in the memory 1305. When the processor 1303 executes the instructions 1309, various portions of the instructions 1309*a* may be loaded onto the processor 1303, and various pieces of data 1307*a* may be loaded onto the processor 1303.

The wireless device 1301 may also include a transmitter 1311 and a receiver 1313 to allow transmission and reception of signals to and from the wireless device 1301. The transmitter 1311 and receiver 1313 may be collectively referred to as a transceiver 1315. An antenna 1317 may be electrically coupled to the transceiver 1315. The wireless device 1301 may also include multiple transmitters, multiple receivers, multiple transceivers and/or multiple antenna (e.g., 1317*a*, 1317*b*).

The various components of the wireless device 1301 may be coupled together by one or more buses, which may include a power bus, a control signal bus, a status signal bus, a data bus, etc. For the sake of clarity, the various buses are illustrated in FIG. 13 as a bus system 1319.

In the above description, reference numbers have sometimes been used in connection with various terms. Where a term is used in connection with a reference number, this is meant to refer to a specific element that is shown in one or more of the Figures. Where a term is used without a reference number, this is meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The term "computer-readable medium" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 5 and 8-12, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for self testing a multiband voltage controlled oscillator (VCO), comprising:
    adjusting a tuning voltage of the VCO, wherein an output of the VCO does not affect an input to the VCO;
    selecting frequency bands in the VCO;
    measuring output frequencies of the VCO;
    determining one or more characteristics about the VCO based on the output frequencies measured in different frequency bands; and
    repeating the adjusting, selecting, measuring, and determining only if the characteristics meet a minimum threshold.

2. The method of claim 1, wherein the adjusting is performed by a programmable tuning voltage generator.

3. The method of claim 1, wherein the determining comprises determining a frequency overlap error between the frequency bands in the voltage controlled oscillator (VCO), wherein the frequency bands comprise a first frequency band that has a band number that is lower and adjacent to a second frequency band.

4. The method of claim 3, wherein the determining comprises:
    determining whether a first output frequency of the voltage controlled oscillator (VCO) at a highest tuning voltage when the first frequency band is selected is greater than or equal to a second output frequency of the VCO at a lowest tuning voltage when the second frequency band is selected; and
    repeating the determining with at least one new frequency band only if the first output frequency is greater than or equal to the second output frequency.

5. The method of claim 1, wherein the determining comprises determining a monotonic error between the frequency bands in the voltage controlled oscillator (VCO), wherein the frequency bands comprise a first frequency band that has a band number that is lower and adjacent to a second frequency band.

6. The method of claim 5, wherein the determining comprises:
    determining whether a second output frequency of the voltage controlled oscillator (VCO) at a medium tuning voltage when the second frequency band is selected is greater than or equal to a first output frequency of the VCO at the medium tuning voltage when the first frequency band is selected; and
    repeating the determining with at least one new frequency band only if the second output frequency is greater than or equal to the first output frequency.

7. The method of claim 1, wherein the determining comprises determining a frequency range error between the frequency bands in the voltage controlled oscillator (VCO), wherein the frequency bands comprise a lowest frequency band in the VCO and a highest frequency band in the VCO.

8. The method of claim 7, wherein the determining comprises:
    determining whether a lowest output frequency of the voltage controlled oscillator (VCO) at a medium tuning voltage when the lowest frequency band is selected is less than or equal to a lowest target frequency; and
    determining whether a highest output frequency of the VCO at a medium tuning voltage when the highest frequency band is selected is greater than or equal to a highest target frequency.

9. The method of claim 1, wherein the self testing is performed on a single integrated circuit.

10. An apparatus for self testing a multiband voltage controlled oscillator (VCO), the apparatus comprising:
    a multiband VCO, wherein an output of the VCO does not affect an input to the VCO;
    a programmable tuning voltage generator that provides a tuning voltage output, wherein the tuning voltage output is configured to adjust a tuning voltage of the VCO; and
    a VCO built in self test controller that is in electronic communication with the programmable tuning voltage generator and the VCO, wherein the VCO built in self test controller is configured to select frequency bands in the VCO, measure output frequencies of the VCO and determine one or more characteristics about the VCO based on the output frequencies measured in different frequency bands;
    wherein the VCO built in self test controller and programmable tuning voltage generator are further configured to repeat the adjusting, selecting, measuring, and determining only if the characteristics meet a minimum threshold.

11. The apparatus of claim 10, wherein one of the characteristics is a frequency overlap error between the frequency bands in the voltage controlled oscillator (VCO), wherein the frequency bands comprise a first frequency band that has a band number that is lower and adjacent to a second frequency band.

12. The apparatus of claim 11, wherein the determining comprises:
    determining whether a first output frequency of the voltage controlled oscillator (VCO) at a highest tuning voltage when the first frequency band is selected is greater than or equal to a second output frequency of the VCO at a lowest tuning voltage when the second frequency band is selected; and
    repeating the determining with at least one new frequency band only if the first output frequency is greater than or equal to the second output frequency.

13. The apparatus of claim 10, wherein one of the characteristics is a monotonic error between the frequency bands in the voltage controlled oscillator (VCO), wherein the frequency bands comprise a first frequency band that has a band number that is lower and adjacent to a second frequency band.

14. The apparatus of claim 13, wherein the determining comprises:
    determining whether a second output frequency of the voltage controlled oscillator (VCO) at a medium tuning voltage when the second frequency band is selected is greater than or equal to a first output frequency of the VCO at the medium tuning voltage when the first frequency band is selected; and
    repeating the determining with at least one new frequency band only if the second output frequency is greater than or equal to the first output frequency.

15. The apparatus of claim 10, wherein one of the characteristics is a frequency range error between the frequency bands in the voltage controlled oscillator (VCO), wherein the frequency bands comprise a lowest frequency band in the VCO and a highest frequency band in the VCO.

16. The apparatus of claim 15, wherein the determining comprises:
    determining whether a lowest output frequency of the voltage controlled oscillator (VCO) at a medium tuning voltage when the lowest frequency band is selected is less than or equal to a lowest target frequency; and
    determining whether a highest output frequency of the VCO at a medium tuning voltage when the highest frequency band is selected is greater than or equal to a highest target frequency.

17. The apparatus of claim 10, wherein the apparatus is a single integrated circuit.

18. An apparatus for self testing a multiband voltage controlled oscillator (VCO), the apparatus comprising:
    means for adjusting a tuning voltage of the VCO, wherein an output of the VCO does not affect an input to the VCO;
    means for selecting frequency bands in the VCO;
    means for measuring output frequencies of the VCO;
    means for determining one or more characteristics about the VCO based on the output frequencies measured in different frequency bands; and
    means for repeating the adjusting, selecting, measuring, and determining only if the characteristics meet a minimum threshold.

19. A computer-program product for self testing a multiband voltage controlled oscillator (VCO), the computer-program product comprising a non-transitory computer-readable medium having instructions thereon, the instructions comprising:
    code for adjusting a tuning voltage of the VCO, wherein an output of the VCO does not affect an input to the VCO;
    code for selecting frequency bands in the VCO;
    code for measuring output frequencies of the VCO;
    code for determining one or more characteristics about the VCO based on the output frequencies measured in different frequency bands; and
    code for repeating the adjusting, selecting, measuring, and determining only if the characteristics meet a minimum threshold.

20. An integrated circuit for self testing a multiband voltage controlled oscillator (VCO), the integrated circuit being configured to:
    adjust a tuning voltage of the VCO, wherein an output of the VCO does not affect an input to the VCO;
    select frequency bands in the VCO;
    measure output frequencies of the VCO;
    determine one or more characteristics about the VCO based on the output frequencies measured in different frequency bands; and
    repeat the adjusting, selecting, measuring, and determining only if the characteristics meet a minimum threshold.

21. At least one processor configured to perform the actions of:
    adjusting a tuning voltage of a voltage controlled oscillator (VCO), wherein an output of the VCO does not affect an input to the VCO;
    selecting frequency bands in the VCO;
    measuring output frequencies of the VCO;
    determining one or more characteristics about the VCO based on the output frequencies measured in different frequency bands; and
    repeating the adjusting, selecting, measuring, and determining only if the characteristics meet a minimum threshold.

* * * * *